United States Patent
Dargis et al.

(10) Patent No.: US 10,923,345 B2
(45) Date of Patent: Feb. 16, 2021

(54) EPITAXIAL METAL OXIDE AS BUFFER FOR EPITAXIAL III-V LAYERS

(71) Applicant: IQE plc, Cardiff (GB)

(72) Inventors: Rytis Dargis, Oak Ridge, NC (US); Andrew Clark, Mountain View, CA (US); Rodney Pelzel, Emmaus, PA (US)

(73) Assignee: IQE plc, Cardiff (GB)

( * ) Notice: Subject to any disclaimer, the term of this patent is extended or adjusted under 35 U.S.C. 154(b) by 171 days.

(21) Appl. No.: 16/088,032

(22) PCT Filed: Mar. 16, 2017

(86) PCT No.: PCT/US2017/022821
§ 371 (c)(1),
(2) Date: Sep. 24, 2018

(87) PCT Pub. No.: WO2017/165197
PCT Pub. Date: Sep. 28, 2017

(65) Prior Publication Data
US 2020/0168454 A1 May 28, 2020

Related U.S. Application Data

(60) Provisional application No. 62/312,058, filed on Mar. 23, 2016.

(51) Int. Cl.
*H01L 29/51* (2006.01)
*H01L 29/20* (2006.01)
*H01L 21/02* (2006.01)

(52) U.S. Cl.
CPC .... *H01L 21/02505* (2013.01); *H01L 21/0254* (2013.01); *H01L 21/02381* (2013.01);
(Continued)

(58) Field of Classification Search
CPC ............... H01L 29/04; H01L 21/02516; H01L 21/02488; H01L 21/02433; C30B 29/16
See application file for complete search history.

(56) References Cited

U.S. PATENT DOCUMENTS 3,454,899 A * 7/1969 Wickersheim ............ H01S 3/16
372/41
8,394,194 B1 * 3/2013 Dargis ...................... C30B 1/02
117/4
(Continued)

FOREIGN PATENT DOCUMENTS

| CN | 103003953 | 3/2013 |
|---|---|---|
| TW | 200845137 | 11/2008 |
| WO | WO 2009/096931 | 8/2009 |

OTHER PUBLICATIONS

Abrashev et al., Raman spectra of R2O3 (R—rare earth) sesquioxides with C-type bixbyite crystal structure: A comparative study, J. Appl. Phys. 116, 103508 (2014); https://doi.org/10.1063/1.4894775 (Year: 2014).*

(Continued)

*Primary Examiner* — Earl N Taylor
(74) *Attorney, Agent, or Firm* — Haley Guiliano LLP

(57) ABSTRACT

Systems and methods are described herein for growing epitaxial metal oxide as buffer for epitaxial III-V layers. A layer structure includes a base layer and a first rare earth oxide layer epitaxially grown over the base layer. The first rare earth oxide layer includes a first rare earth element and oxygen, and has a bixbyite crystal structure. The layer structure also includes a metal oxide layer epitaxially grown directly over the first rare earth oxide layer. The metal oxide layer includes a first cation element selected from Group III and oxygen, and has a bixbyite crystal structure.

15 Claims, 17 Drawing Sheets

(52) U.S. Cl.
CPC .......... *H01L 29/511* (2013.01); *H01L 29/517* (2013.01); *H01L 29/20* (2013.01); *H01L 2924/01106* (2013.01)

(56) References Cited

U.S. PATENT DOCUMENTS

| | | | | |
|---|---|---|---|---|
| 8,796,121 | B1* | 8/2014 | Dargis | C30B 25/22 438/496 |
| 8,846,504 | B1* | 9/2014 | Dargis | H01L 21/02488 438/481 |
| 2002/0119659 | A1* | 8/2002 | Ami | H01L 21/31654 438/689 |
| 2003/0008520 | A1* | 1/2003 | Bojarczuk, Jr. | B82Y 10/00 438/752 |
| 2003/0008521 | A1* | 1/2003 | Bojarczuk, Jr. | H01L 21/02488 438/752 |
| 2003/0136331 | A1* | 7/2003 | Ami | C30B 29/16 117/2 |
| 2006/0060826 | A1* | 3/2006 | Atanackovic | G02B 6/1225 252/500 |
| 2008/0217622 | A1* | 9/2008 | Goyal | H01L 21/02491 257/64 |
| 2008/0217695 | A1* | 9/2008 | Atanackovic | H01L 21/84 257/369 |
| 2008/0265255 | A1* | 10/2008 | Goyal | H01L 31/0687 257/64 |
| 2008/0295879 | A1* | 12/2008 | Atanackovic | H01L 37/025 136/238 |
| 2011/0315936 | A1* | 12/2011 | Inoue | H01L 29/7869 252/512 |
| 2012/0104567 | A1* | 5/2012 | Clark | H01L 21/7624 257/635 |
| 2012/0183767 | A1* | 7/2012 | Dargis | H01L 31/1848 428/336 |
| 2013/0032858 | A1* | 2/2013 | Clark | H01L 21/02439 257/190 |
| 2014/0167057 | A1* | 6/2014 | Arkun | H01L 21/02381 257/76 |
| 2014/0264776 | A1* | 9/2014 | Thapa | H01L 29/045 257/627 |
| 2015/0014676 | A1* | 1/2015 | Dargis | H01L 21/02502 257/43 |
| 2015/0203990 | A1* | 7/2015 | Dargis | H01L 21/02521 257/76 |
| 2019/0122885 | A1* | 4/2019 | Dargis | H01L 21/02381 |
| 2020/0168454 | A1* | 5/2020 | Dargis | H01L 21/0254 |

OTHER PUBLICATIONS

International Search Report and Written Opinion in Application No. PCT/US2017/022821, dated May 31, 2017 (12 pages).

* cited by examiner

EPITAXIAL METAL OXIDE AS BUFFER FOR EPITAXIAL III-V LAYERS

CROSS-REFERENCE TO RELATED APPLICATIONS

This application is a national stage application under 35 U.S.C. § 371 of International Application PCT/US2017/022821, filed Mar. 16, 2017 which claims priority to U.S. Provisional Application Ser. No. 62/312,058, filed Mar. 23, 2016, of which the entire contents are hereby incorporated by reference herein in their entireties.

BACKGROUND

Photonic and/or electronic devices are often made of III-V materials, but III-V substrates are expensive. Silicon substrates are relatively inexpensive, but III-V materials cannot be grown directly on them. Even when buffer layers are used, the III-V materials often contain dislocations and defects due to the lattice mismatch between the III-V materials and silicon, impairing performance of the photonic and/or electronic devices.

SUMMARY

Systems and methods are described herein for growing epitaxial metal oxide as buffer for epitaxial III-V layers. A layer structure includes a base layer and a first rare earth oxide layer epitaxially grown over the base layer. The first rare earth oxide layer includes a first rare earth element and oxygen, and has a bixbyite crystal structure. The layer structure also includes a metal oxide layer epitaxially grown directly over the first rare earth oxide layer. The metal oxide layer includes a first cation element selected from Group III and oxygen, and has a bixbyite crystal structure.

The first rare earth oxide layer can include a second rare earth element. The layer structure can further include a III-nitride layer epitaxially grown over the metal oxide layer.

In some examples, a first region of the first rare earth oxide layer adjacent to the base layer does not contain the second rare earth element, except for unintentional impurities. Also in these examples, a second region of the first rare earth oxide layer adjacent to the metal oxide layer does not contain the first rare earth element, except for unintentional impurities.

In some examples, a concentration of the first rare earth element varies from a maximum at the first region to approximately zero at the second region in a graded or stepwise manner, except for unintentional impurities. Also in these examples, a concentration of the second rare earth element varies from approximately zero at the first region to a maximum at the second region in a graded or stepwise manner, except for unintentional impurities.

The layer structure can further include a second rare earth oxide layer between the first rare earth oxide layer and the base layer.

The metal oxide layer can include a second cation element selected from Group III or Group IV. The metal oxide layer can include a first region of the metal oxide layer adjacent to the first rare earth oxide layer and a second region of the metal oxide layer adjacent to a top surface of the metal oxide layer. A concentration of the second cation element can vary from approximately zero at the first region to a maximum at the second region in a graded or stepwise manner, except for unintentional impurities.

The layer structure can further include a first metal-containing layer over the metal oxide layer. The first metal-containing layer includes the second cation element, oxygen, and a first anion element selected from Group V. The first metal-containing layer includes a first region of the first metal-containing layer adjacent to the metal oxide layer and a second region of the first metal-containing layer adjacent to a top surface of the first metal-containing layer. A concentration of oxygen varies from a maximum at the first region to approximately zero at the second region in a graded or stepwise manner, except for unintentional impurities. A concentration of the anion element varies from approximately zero at the first region to a maximum at the second region in a graded or stepwise manner, except for unintentional impurities.

The anion element comprises As or P.

The layer structure can include a second metal-containing layer over the first metal-containing layer. The second metal-containing layer includes a cation element that is also contained in the first metal-containing layer, the first anion element, and a second anion element selected from Group V. The second metal-containing layer comprises a first region of the second metal-containing layer adjacent to the metal oxide layer and a second region of the second metal-containing layer adjacent to a top surface of the second metal-containing layer. A concentration of the first anion element varies from a maximum at the first region to approximately zero at the second region in a graded or stepwise manner, except for unintentional impurities. A concentration of the second anion element varies from approximately zero at the first region to a maximum at the second region in a graded or stepwise manner, except for unintentional impurities.

The layer structure can further include a device layer over the second metal-containing layer, wherein the device layer comprises the second anion element.

The metal oxide layer can include a transition in crystal structure from bixbyite to a second crystal structure.

The layer structure can further include a second rare earth oxide layer epitaxially grown over the metal oxide layer. The second rare earth oxide layer includes the first rare earth element and oxygen, and has a bixbyite crystal structure. The layer structure can also further include a second metal oxide layer epitaxially grown directly over the second rare earth oxide layer. The second metal oxide layer includes the first cation element and oxygen, and has a bixbyite crystal structure.

BRIEF DESCRIPTION OF THE DRAWINGS

The above and other features of the present disclosure will be more apparent upon consideration of the following detailed description, taken in conjunction with the accompanying drawings in which.

DETAILED DESCRIPTION

Figure 1:
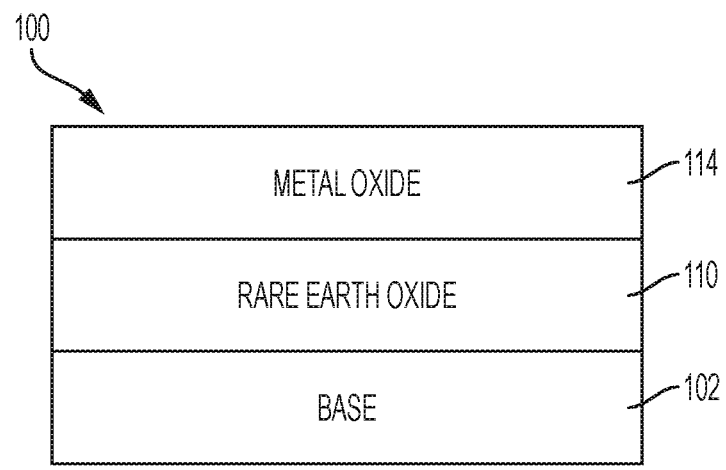
FIG. 1 depicts a layer structure with a metal oxide layer over a rare earth oxide layer, according to an illustrative implementation.

In the following description, numerous details are set forth for the purpose of explanation. However, one of ordinary skill in the art will realize that the embodiments described herein may be practiced without the use of these specific details. In other instances, well-known structures and devices are shown in block diagram form so that the description will not be obscured with unnecessary detail.

Rare earth oxide materials and metal oxide materials can be used as buffer layers for epitaxial growth of III-V layers on silicon substrates. The rare earth oxide and metal oxide layers can be graded in composition and lattice constant to result in small or no mismatches in lattice constant and high crystal quality throughout the layer structures.

A rare earth oxide (REO) material is a material that contains oxygen and one, two, or more rare earth (RE) elements. The rare earth elements include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), luthium (Lu), scandium (Sc) and yttrium (Y).

Rare-earth oxides are known to exhibit fluorite-type structures. These structures exhibit morphology differences as a function of the atomic weight of the rare-earth element present in the oxide, among any other factors.

In particular, oxides comprising lighter rare-earths form cubic $CaF_2$-type crystal structure as a result of possible ionization states of +2 and/or +3 and/or +4. Oxides having this crystal structure exhibit significant net charge defect due to a multiplicity of possible oxidation states (for rare-earth oxides). On the other hand, oxides formed from heavier rare-earth elements (e.g., $RE_2O_3$, etc.), exhibit a distorted $CaF_2$-type crystal structure known as bixbyite which includes anion vacancies due to an ionization state of RE<3+>. These heavier rare earth elements include $Lu_2O_3$, $Yb_2O_3$, $Tm_2O_3$, $Er_2O_3$, $Ho_2O_3$, $Dy_2O_3$, $Tb_2O_3$, $Gd_2O_3$, $Sm_2O_3$.

An illustrative example of a rare-earth oxide having the formula $RE_2O_3$, is $Er_2O_3$. The crystal structure of a unit cell of $Er_2O_3$ is an oxygen-vacancy-derived fluorite derivative (i.e., bixbyite structure). REO dielectric layers can comprise an assemblage of these unit cells.

The number and position of the anion vacancies determines the crystal shape of the $RE_2O_3$ unit cell. The crystal shape of this cell can be engineered to provide a suitable match to the lattice constant of the underlying semiconductor substrate. Oxygen vacancies along the body diagonal and/or the face diagonal lead to a C-type cubic structure. For example, two anion vacancies per fluorite unit cell causes the transformation of the lattice structure to a $CaF_2$-type structure to cubic bixbyite, which for $Er_2O_3$ has a lattice constant that is nearly twice as large as the lattice constant of Si. This, in turn, enables low-strain, single-phase $Er_2O_3$ to be epitaxially grown directly on a silicon substrate.

Furthermore, the number and position of the anion vacancies can be engineered to induce a desired strain (tensile or compressive) in the dielectric layer and/or overgrown layers. For example, in some embodiments, strain in the semiconductor layer is desired in order to affect carrier mobility.

The cubic bixbyite structure has 48 metal cations, 32 oxygen anions and 16 oxygen vacancies arranged diagonally in every of 8 subcells, thereby doubling its lattice constant, which provides a suitable match to the lattice constant of <100> silicon. In some examples, oxygen vacancies lie at the ends of the face diagonal. In some other examples, oxygen vacancies are distributed between the ends of the face diagonal and the body diagonal.

FIG. 1 depicts a layer structure 100 with a metal oxide layer over a rare earth oxide layer. The layer structure 100 includes a base layer 102, a rare earth oxide layer 110 epitaxially grown over the base layer 102, and a metal oxide layer 114 epitaxially grown over the rare earth oxide layer 110. The base layer 102 can be any semiconductor or insulating layer that provides an epitaxial template for growth of the layer structure 100. The base layer 102 is, for example, a silicon substrate with a crystal orientation of <111>, <110>, <112>, <113>, or <114>. However, the base layer 102 can also be a silicon layer over an insulator layer, as in an SOI substrate, or can be a silicon layer epitaxially grown over another layer. The rare earth oxide layer 110 includes at least one rare earth element and oxygen, and has a bixbyite crystal structure. In some examples, the rare earth oxide 110 also includes a second rare earth element. The rare earth oxide layer 110 can include a first region adjacent to the base layer 102 and a second region adjacent to the metal oxide layer 114. The concentration of the first rare earth oxide element is at a maximum in the first region and is approximately zero in the second region. The concentration of the first rare earth element varies across the metal oxide layer 114 in a graded, stepwise, linear, sublinear, or superlinear manner from a maximum at the first region to approximately zero at the second region. Conversely, the concentration of the second rare earth oxide element is approximately zero in the first region and is at a maximum in the second region. The concentration of the second rare earth element varies across the rare earth oxide layer 110 in a graded, stepwise, linear, sublinear, or supralinear manner from approximately zero at the first region to a maximum at the second region. Accordingly, the first region of the rare earth oxide layer 110 does not contain the second rare earth element, except for unintentional impurities, and the second region of the rare earth oxide layer 110 does not contain the first rare earth element, except for unintentional impurities.

The metal oxide layer 114 includes a first cation element selected from Group III or Group IV of the Periodic Table, and oxygen. The metal oxide layer 114 has a bixbyite crystal structure. In some examples, the metal oxide layer 114 does not contain nitrogen, except for unintentional impurities that may result from contamination and/or prior deposition processes.

In some examples, the metal oxide layer includes a second cation element selected from Group III or Group IV of the Periodic Table. In these examples, the concentrations of the first and second cation elements vary throughout the metal oxide layer 114. The metal oxide layer 114 can include a first region adjacent to the rare earth oxide layer 110 and a second region adjacent to a top surface of the metal oxide layer 114. The concentration of the first cation element is at a maximum in the first region and is approximately zero in the second region. The concentration of the first cation element varies across the metal oxide layer 114 in a graded, stepwise, linear, sublinear, or supralinear manner from a maximum at the first region to approximately zero at the second region. Accordingly, the first region of the metal oxide layer 114 does not contain the second cation element, except for unintentional impurities, and the second region of the metal oxide layer 114 does not contain the first cation element, except for unintentional impurities. As the concentration of the second cation element increases, the metal oxide layer 114 transitions from a bixbyite crystal structure to a second crystal structure. The second crystal structure is monoclinic, corundum, or cubic spinel-based structure (so called defective spinel structure). The second crystal structure can also be polycrystalline. The second cation element can be gallium such that the second region of the metal oxide layer 114 comprises gallium oxide. The transition from bixbyite to the second crystal structure can be graded, stepwise, or accomplished with a superlattice.

Figure 2:
FIG. 2 depicts a layer structure that is a specific example of the layer structure shown in FIG. 1, according to an illustrative implementation.

FIG. 2 depicts a layer structure 200 that is a specific example of the layer structure 100. The layer structure 200 includes a silicon layer 202, a rare earth oxide layer 210 epitaxially grown over the silicon layer 202, and a metal oxide layer 214 epitaxially grown over the rare earth oxide layer 210. The silicon layer 202 contains silicon and has a <111> orientation. The base layer 202 can be any semiconductor or insulating layer that provides an epitaxial template for growth of the layer structure 200. The base layer 202 is, for example, a silicon substrate with a crystal orientation of <111>, <110>, <112>, <113>, or <114>. However, the base layer 202 can also be a silicon layer over an insulator layer, as in an SOI substrate, or can be a silicon layer epitaxially grown over another layer. The rare earth oxide layer 210 has the chemical formula $(RE1_xRE2_{1-x})_aO_b$, ($0 \leq x \leq 1$; $1 \leq a \leq 3$; $2 \leq b \leq 4$). The cations RE1 and RE2 are rare earth metals. The relative concentrations of the rare earth metals can vary across the rare earth oxide layer 210, and thus x can vary across the layer 210. The coefficient x can vary in a graded (linear, sublinear, or supralinear), or stepwise manner. The values of x at various locations within the rare earth oxide layer 210 are chosen to engineer the lattice mismatch at the interfaces between the metal oxide layer 214 and the silicon layer 202. In one example, x varies from 1 at a first region of the rare earth oxide layer 110 adjacent to the base layer 102 to 0 at a second region of first rare earth oxide layer 110 adjacent to the metal oxide layer 102. Thus, the first region of first rare earth oxide layer 110 adjacent to the base layer 102 does not contain the second rare earth element RE2, except for unintentional impurities, and the second region of first rare earth oxide layer 110 adjacent to the metal oxide layer 102 does not contain the first rare earth element RE1, except for unintentional impurities. Accordingly, the concentration of the first rare earth element RE1 varies from a maximum at the first region to approximately zero at the second region in a graded or stepwise manner, except for unintentional impurities, and a concentration of the second rare earth element RE2 varies from approximately zero at the first region to a maximum at the second region in a graded or stepwise manner, except for unintentional impurities.

In one example, RE1 is scandium and RE2 is erbium such that the rare earth oxide 210 comprises $(Sc_xEr_{1-x})_aO_b$ ($0 \leq x \leq 1$; $1 \leq a \leq 3$; $2 \leq b \leq 4$). In another example, RE1 is gadolinium and RE2 is erbium such that the rare earth oxide 210 comprises $(Gd_xEr_{1-x})_aO_b$ ($0 \leq x \leq 1$; $1 \leq a \leq 3$; $2 \leq b \leq 4$). In the example shown in FIG. 4, $(Sc_{0.65}Er_{0.35})_2O_3$ is lattice matched to $In_2O_3$, and $(Sc_{0.8}Er_{0.2})_2O_3(111)$ is lattice matched to InN(0001) In other examples, the rare earth oxide 210 comprises other pairs of rare earth metals. Because x can be either 0 or 1, the rare earth oxide layer 210 can include only one type of rare earth metal in some examples. In one particular example, RE2 is erbium, x=0, a=2, and b=3, such that the rare earth oxide 210 comprises $Er_2O_3$.

The metal oxide layer 214 comprises a metal oxide material having the chemical formula $(M1_zM2_{1-z})_aO_b$, ($0 \leq x \leq 1$; $1 \leq a \leq 3$; $2 \leq b \leq 4$). The metal elements M1 and M2 are selected from transition metals, Group III metals such as aluminum, gallium, or indium, or Group IV metals such as tin or lead. In one example, M1 is indium, z=1, a=2, and b=3 such that the metal oxide 214 comprises $In_2O_3$. In another example, M1 is indium, M2 is tin, a=2, and b=3, such that the metal oxide comprises $(In_zSn_{1-z})_2O_3$, ($0 \leq x \leq 1$; $1 \leq a \leq 3$; $2 \leq b \leq 4$). Either of these two examples can be used in conjunction with either of the two examples of the rare earth oxide 210 described in the above paragraph, or with other rare earth oxides as the rare earth oxide 210.

Figure 3:
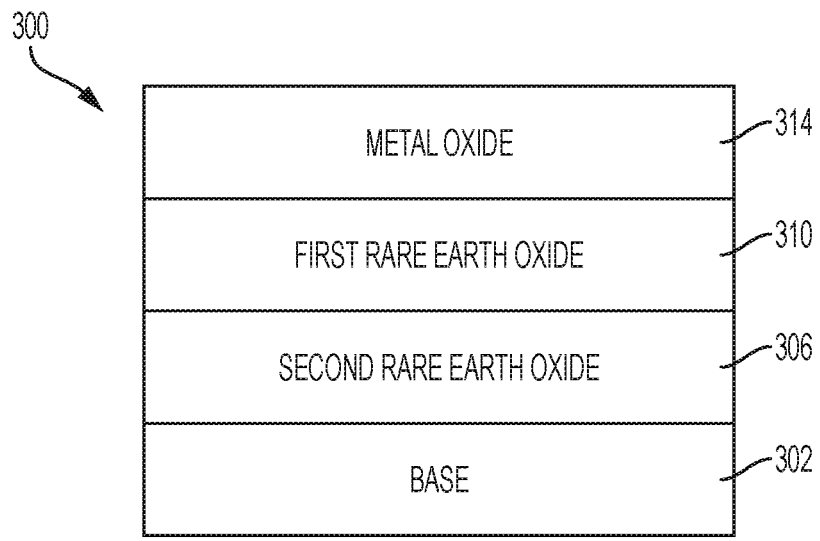
FIG. 3 depicts a layer structure that comprises two rare earth oxide layers, according to an illustrative implementation.

FIG. 3 depicts a layer structure 300 that comprises two rare earth oxide layers. The layer structure 300 includes a base layer 302, a second rare earth oxide layer 306 epitaxially grown over the base layer 302, a first rare earth oxide layer 310 epitaxially grown over the second rare earth oxide layer 306, and a metal oxide layer 314 epitaxially grown over the first rare earth oxide layer 310. The layer structure 300 is the same as the layer structure 100, except that it contains two rare earth oxide layers instead of one. Thus, the base layer 302 is the same as the base layer 102 and the metal oxide layer 314 is the same as the metal oxide layer 114. Like the rare earth oxide layer 110, the first and second rare earth oxide layers 310 and 306 contain rare earth oxides having the chemical formula $(RE1_xRE2_{1-x})_aO_b$, ($0 \leq x \leq 1$; $1 \leq a \leq 3$; $2 \leq b \leq 4$). The cations RE1 and RE2 are rare earth metals. Accordingly, the layer structure 300 includes a second rare earth oxide layer 306 between the first rare earth oxide layer 310 and the base layer 302.

Figure 4:
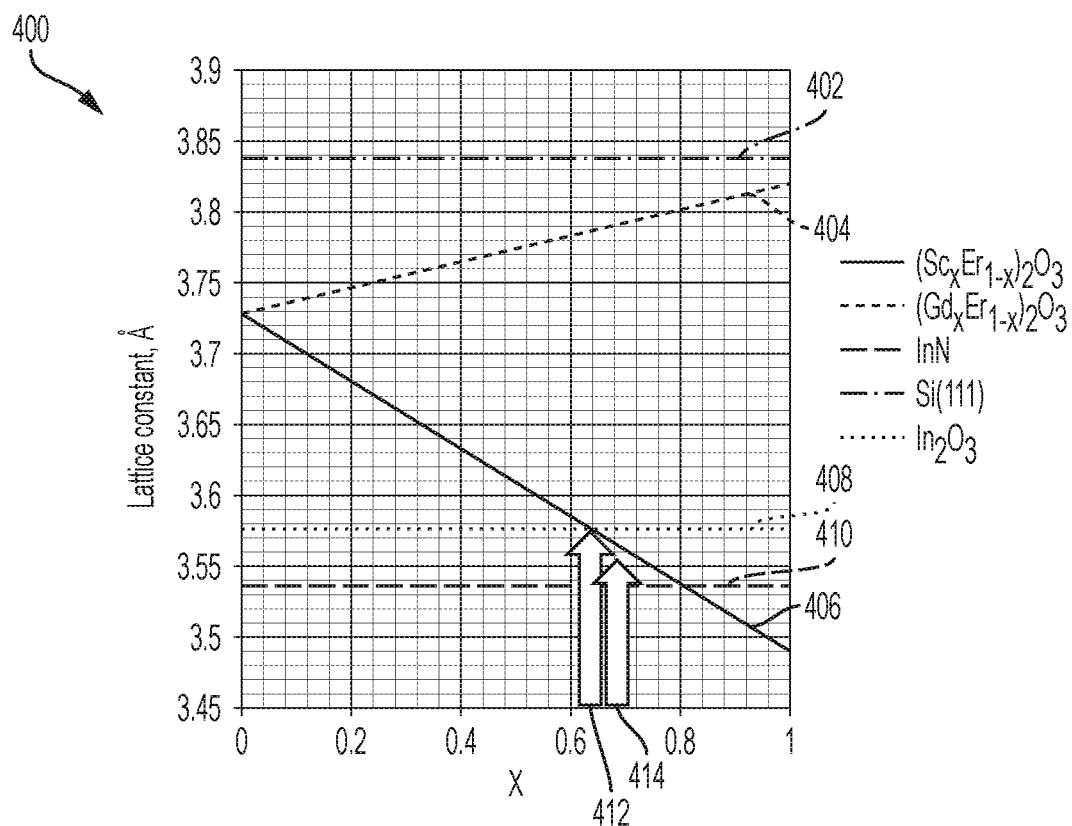
FIG. 4 depicts a graph that shows lattice constants of various materials that can be used in the layer structures described herein, according to an illustrative implementation.

FIG. 4 depicts a graph 400 that shows lattice constants of various materials that can be used in the layer structures described herein. The graph 400 includes curves 402, 404, 306, 408, and 310, as well as arrows 412 and 414. The curve 402 shows that Si <111> has a lattice constant of approximately 3.84 Å. The curve 408 shows that $In_2O_3$ has a lattice constant of approximately 3.58 Å, and the curve 310 shows that InN has a lattice constant of approximately 3.54 Å. The curve 404 depicts the lattice constant for $(Gd_xEr_{1-x})_2O_3$ as a function of gadolinium fraction, x. The curve 306 depicts the lattice constant of $(Sc_xEr_{1-x})_2O_3$ as a function of scandium fraction, x. The fraction (x) of scandium and gadolinium in these alloys can be chosen to match lattice constants between the rare earth oxide layers 310 and 306 along with other layers.

In one example, the base layer 302 comprises Si<111>, a=2, and b=3. In this example, in the second rare earth oxide layer 306, RE1 is gadolinium and RE2 is erbium such that the second rare earth oxide layer 306 comprises $(Gd_xEr_{1-x})_2O_3$ ($0 \leq x \leq 1$). In this example, in the first rare earth oxide layer 310, RE1 is scandium and RE2 is erbium such that the first rare earth oxide layer 310 comprises $(Sc_xEr_{1-x})_2O_3$ ($0 \leq x \leq 1$). In this example, x varies through the second rare earth oxide layer from a value of 1 at the interface with the Si<111> of the base layer 302 to a value of 0 at the interface with the first rare earth oxide layer 310. Accordingly, the second rare earth oxide layer 306 comprises $Gd_2O_3$ at the interface with the Si<111> of the base layer 302, it comprises $(Gd_xEr_{1-x})_2O_3$ away from its interfaces, and it comprises $Er_2O_3$ at the interface with the first rare earth oxide layer 310. Also in this example, x varies through the first rare earth oxide layer (comprising $(Sc_xEr_{1-x})_aO_b$) from a value of 0 at the interface with the second rare earth oxide layer 306 to a value of approximately 0.64 at the interface with the metal oxide layer 314. Accordingly, the first rare earth oxide layer 310 comprises $Er_2O_3$ at the interface with the second rare earth oxide layer 306, it comprises $(Sc_xEr_{1-x})_2O_3$ away from its interfaces, and it comprises $Sc_2O_3$ at the interface with the metal oxide layer 314. In this example, the metal oxide layer comprises $In_2O_3$.

In the example described in the preceding paragraph, the lattice constant is well-matched throughout the layer structure 300. The lattice constant of the Si<111> of the base layer 302 is approximately 3.84 Å, and the lattice constant of the $Gd_2O_3$ of the second rare earth oxide layer 306 at the interface with the base layer 302 is approximately 3.82 Å, a difference of 0.5%. As the second rare earth oxide layer varies in composition from $Gd_2O_3$ to $(Gd_xEr_{1-x})_2O_3$ to $Er_2O_3$ at the interface with the first rare earth oxide layer, the lattice constant varies from approximately 3.82 Å ($Gd_2O_3$) to approximately 3.73 Å ($Er_2O_3$). As the first rare earth oxide layer varies in composition from $Er_2O_3$ at the interface with the second rare earth oxide layer to $(Sc_xEr_{1-x})_2O_3$ to $Sc_2O_3$ at the interface with the first rare earth oxide layer, the lattice constant varies from approximately 3.73 Å ($Er_2O_3$) to approximately 3.58 Å ($(Sc_{0.64}Er_{0.36})_2O_3$) at the interface with the $In_2O_3$ of the metal oxide layer 314. Because $In_2O_3$ has a lattice constant of approximately 3.58 Å, the difference across the interface between the first rare earth oxide layer 310 and the metal oxide layer 314 is minimal. Although the lattice constant varies through the layer structure 300 from 3.84 Å in the base layer 302 to 3.58 Å in the metal oxide layer 314, a difference of 6.7%, the change in lattice constant is continuous and gradual, and the only abrupt change (between the layers 302 and 306) involves only a difference of 0.5%. In both the first rare earth oxide layer 310 and the second rare earth oxide layer 306, the coefficient x can vary in a linear, sublinear, supralinear, or stepwise manner. In this way, the layer structure 300 has minimal dislocations and defects due to changes in lattice constant.

Figure 5:
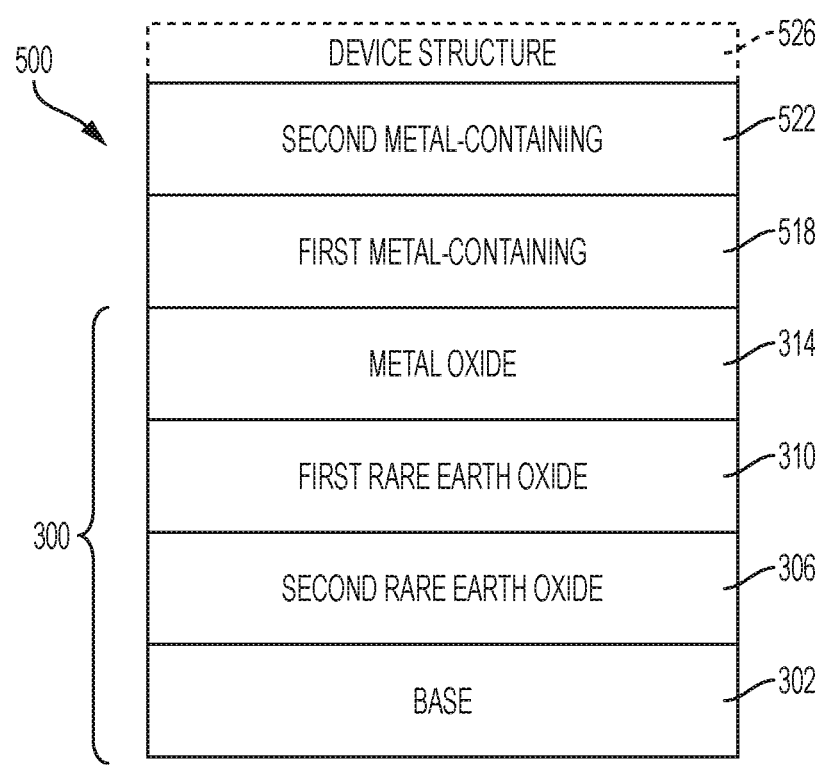
FIG. 5 depicts a layer structure that includes metal-containing layers and an optional device structure grown over the layer structure shown in FIG. 3, according to an illustrative implementation.

FIG. 5 depicts a layer structure 500 that includes metal-containing layers and an optional device structure grown over the layer structure 300. The layer structure 500 includes a first metal-containing layer 518 epitaxially grown over the metal oxide layer 314 and a second metal-containing layer 522 epitaxially grown over the first metal-containing layer 518. The layer structure 500 can optionally include a device layer 526 epitaxially grown over the second metal-containing layer 522. The first and second metal-containing layers 518 and 522 comprise cation elements that include one or more of transition metals, Group III metals such as aluminum, gallium, and indium, and Group IV metals such as tin or lead. The first and second metal-containing layers 518 and 522 comprise one or more anion elements from Groups V and VI such as nitrogen, phosphorus, arsenic, antimony, oxygen, sulfur, and selenium.

Figure 6:
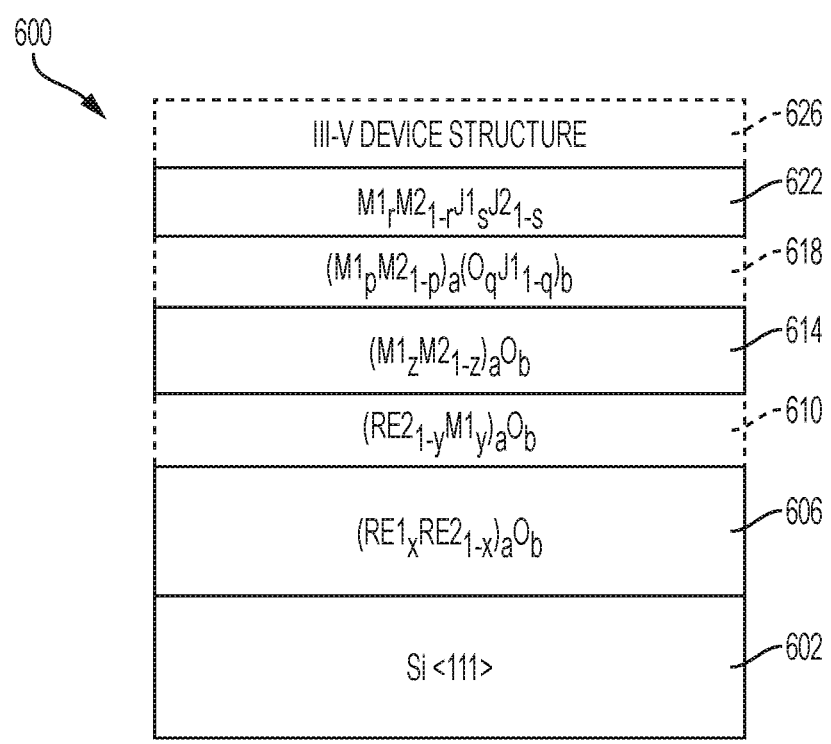
FIG. 6 depicts a layer structure that is a specific example of the layer structure shown in FIG. 5, according to an illustrative implementation.

FIG. 6 depicts a layer structure 600 that is a specific example of the layer structure 500. The layer structure 600 includes a silicon layer 602 having a <111> orientation, and a rare earth oxide layer 606 epitaxially grown over the silicon layer 602. The base layer 602 can be any semiconductor or insulating layer that provides an epitaxial template for growth of the layer structure 600. The base layer 602 is, for example, a silicon substrate with a crystal orientation of <111>. However, the base layer 602 can also be a silicon <111> layer over an insulator layer, as in an SOI substrate, or can be a silicon <111> layer epitaxially grown over another layer. The rare earth oxide layer 606 has the same characteristics as the rare earth oxide layer 210 as described above. The layer structure 600 can optionally include a rare earth-metal oxide layer 610 epitaxially grown over the rare earth oxide layer 606. The rare earth-metal oxide layer 610 has a chemical formula $(RE2_{1-y}M1_y)_aO_b$ ($0 \leq y \leq 1$; $1 \leq a \leq 3$; $2 \leq b \leq 4$). The element RE2 is a rare earth metal, and the element M1 is an element selected from the transition metals, Group III metals such as aluminum, gallium, and indium, and Group IV metals such as tin or lead. The layer structure 600 also includes a metal oxide layer 614 epitaxially grown over the rare earth oxide layer 606 (or instead, if included, over the rare earth-metal oxide layer 610). The layer structure 600 can optionally include a metal oxide layer 618 epitaxially grown over the metal oxide layer 214. The metal-containing layer 618 includes metal elements M1 and M2, oxygen, and anion element J1 and has as the chemical formula $(M1_pM2_{1-p})_a(O_qJ1_{1-q})_b$ ($0 \leq p \leq 1$; $0 \leq q \leq 1$; $1 \leq a \leq 3$; $2 \leq b \leq 4$). The metal element M1 in the metal-containing layer 618 is the same metal element as the metal element M1 in the rare earth-metal oxide layer 610. The element M2 is an element selected from the transition metals, Group III metals such as aluminum, gallium, and indium, and Group IV metals such as tin or lead. The anion element J1 is an element from Groups V or VI such as nitrogen, phosphorus, arsenic, antimony, sulfur, and selenium.

In one example, q varies from 1 at a first region of the metal-containing layer 618 adjacent to the metal oxide layer 614 to 0 at a second region of the metal-containing layer 618 adjacent to the metal-containing layer 622. Thus, the first region of the metal-containing layer 618 adjacent to the metal oxide layer 614 does not contain the anion element J1, except for unintentional impurities, and the second region of the metal-containing layer 618 adjacent to the metal-containing layer 622 does not contain oxygen, except for unintentional impurities. Accordingly, the concentration of oxygen varies from a maximum at the first region to approximately zero at the second region in a graded or stepwise manner, except for unintentional impurities, and a concentration of the anion element J1 varies from approximately zero at the first region to a maximum at the second region in a graded or stepwise manner, except for unintentional impurities.

The layer structure 600 also includes a metal-containing layer 622 epitaxially grown over the metal oxide layer 214 (or instead, if included, the metal-containing layer 618). The metal-containing layer 622 includes the same elements M1, M2, and J1 as contained in the metal-containing layer 618 as well as an additional anion element J2 from Groups V or VI such as nitrogen, phosphorus, arsenic, antimony, sulfur, and selenium. The metal-containing layer 622 has the chemical formula $M1_rM2_{1-r}J1_sJ2_{1-s}$ ($0 \leq r \leq 1$; $0 \leq s \leq 1$). The layer structure 600 can optionally include a III-V device structure 626 epitaxially grown over the metal-containing layer 622. The III-V device structure 626 is an electronic or photonic device.

In one example, s varies from 1 at a first region of the metal-containing layer 622 adjacent to the metal-containing layer 618 to 0 at a second region of the metal-containing layer 622 adjacent to the III-V device structure 626. Thus, the first region of the metal-containing layer 622 adjacent to the metal oxide layer 618 does not contain the anion element J2, except for unintentional impurities, and the second region of the metal-containing layer 622 adjacent to the III-V device structure 626 does not contain the anion element J1, except for unintentional impurities. Accordingly, the concentration of the anion element J1 varies from a maximum at the first region to approximately zero at the second region in a graded or stepwise manner, except for unintentional impurities, and a concentration of the anion element J2 varies from approximately zero at the first region to a maximum at the second region in a graded or stepwise manner, except for unintentional impurities.

Because the layer structure 600 is a specific example of the layer structure 500, each of the layers in the layer structure 600 is a specific example of a corresponding layer in the layer structure 500. The silicon layer 602 is an example of the base layer 302. The rare earth oxide layer 606 is an example of the second rare earth oxide layer 306. The rare earth oxide layer 610 is an example of the first rare earth oxide layer 310. The metal oxide layer 614 is an example of the metal oxide layer 314. The metal-containing layer 618 is an example of the first metal-containing layer 518. The metal-containing layer 622 is an example of the second metal-containing layer 522. The III-V device structure 626 is an example of the device structure 526. The III-V device structure 626 contains the anion element J2.

Figure 7:
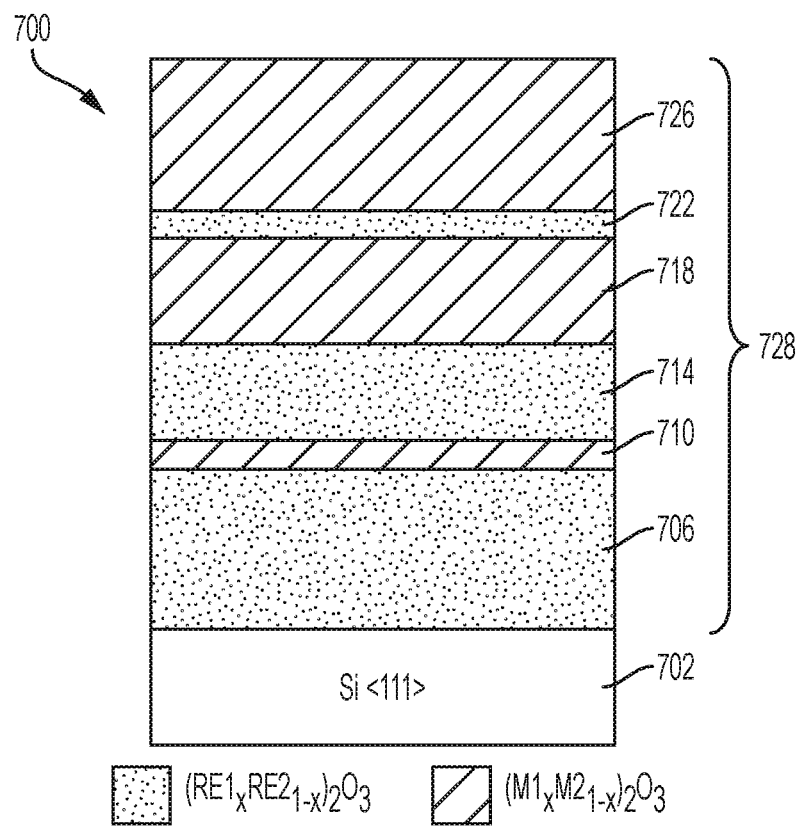
FIG. 7 depicts a layer structure that includes a multi-layer structure, according to an illustrative implementation.
Figure 8:
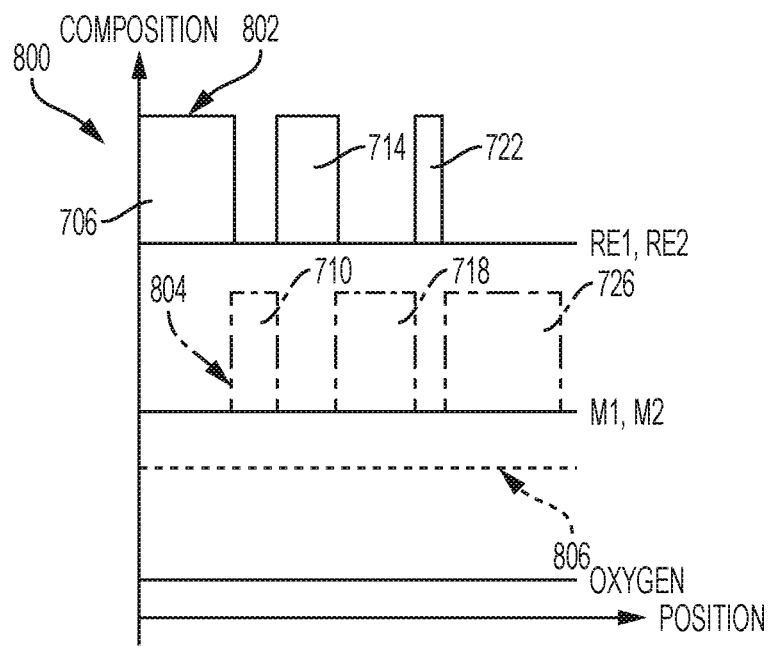
FIG. 8 depicts a graph that shows composition of the multi-layer structure shown in FIG. 7 as a function of position within the multi-layer structure, according to an illustrative implementation.

FIG. 7 depicts a layer structure 700 that includes a multi-layer structure. The layer structure 700 includes a silicon layer 702 having a <111> orientation and a multi-layer structure 728 epitaxially grown over the silicon layer 702. The silicon layer 702 can be replaced by any semiconductor or insulating layer that provides an epitaxial template for growth of the layer structure 700. The silicon layer 702 is, for example, a silicon substrate with a crystal orientation of <111>, <110>, <112>, <113>, or <114>. However, the silicon layer 702 can also be a silicon layer over an insulator layer, as in an SOI substrate, or can be a silicon layer epitaxially grown over another layer. The multi-layer structure 726 includes a rare earth oxide layer 706 epitaxially grown over the silicon layer 702, and a metal oxide layer 710 epitaxially grown over the rare earth oxide layer 706. The layer structure 700 also includes a rare earth oxide layer 714 epitaxially grown over the metal oxide layer 710, a metal oxide layer 718 epitaxially grown over the rare earth oxide layer 714, a rare earth oxide layer 722 epitaxially grown over the metal oxide layer 718, and a metal oxide layer 726 epitaxially grown over the rare earth oxide layer 722. The rare earth oxide layers 706, 714, and 722 have a composition of $(RE1_xRE2_{1-x})_2O_3$ ($0 \leq x \leq 1$). The cations RE1 and RE2 are rare earth metals. The metal oxide layers 710, 718, and 726 have a composition of $(M1_xM2_{1-x})_2O_3$ ($0 \leq x \leq 1$). The rare earth oxide layers and metal oxide layers alternate in the layer structure 700, and the layer structure 700 can include a different number of alternating rare earth oxide and metal oxide layers than depicted in FIG. 7. The thicknesses of the layers of the layer structure 700 can be equal, or they can be scaled as shown in FIG. 8. Because the alternating rare earth oxide and metal oxide layers share a common cation:anion ratio (2:3) and a common anion (oxygen), the multi-layer structure 728 has chemical compatibility across each interface. The layer structure 700 can be part of both electronic and photonic semiconductor devices, and in particular devices for high frequency and/or high performance operation. The layer structure 700 can also include acoustic mirrors for high frequency applications.

FIG. 8 depicts a graph 800 that shows composition of the multi-layer structure 728 as a function of position within the multi-layer structure 728. The graph 800 includes curves 802, 804, and 806. The curve 802 shows that the multi-layer structure 728 contains rare earth elements RE1 and RE2 in the rare earth oxide layers 706, 714, and 722. The curve 804 shows that the multi-layer structure 728 includes metal elements M1 and M2 and the layers 710, 718, and 726. The curve 806 shows that the multi-layer structure 728 has a concentration of oxygen throughout the structure. By alternating metal oxide and rare earth oxide with thicknesses appropriately chosen, the strain of the multi-layer structure 728 can be balanced such that a layer can be grown at the top without dislocations or other defects.

Figure 9:
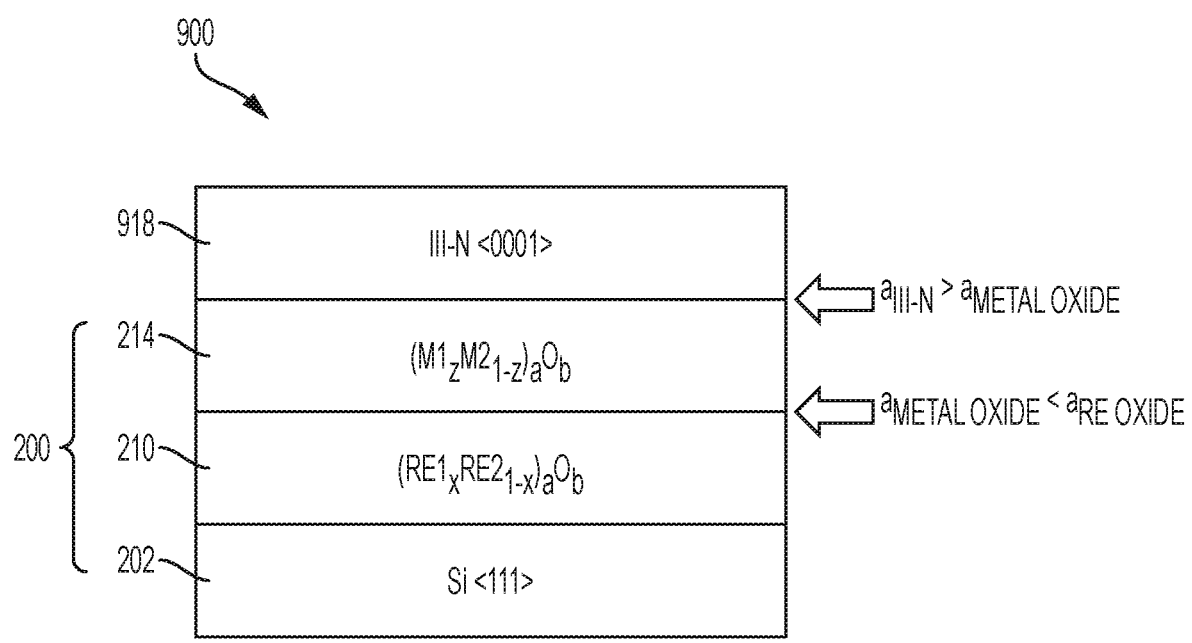
FIG. 9 depicts a layer structure that includes a III-nitride layer, according to an illustrative implementation.

FIG. 9 depicts a layer structure 900 that includes a III-nitride layer. The layer structure 900 includes a III-nitride layer 918 epitaxially grown over the layer structure 200. The III-nitride layer 918 has a <0001> orientation and comprises one or more Group III elements and nitrogen. Examples of III-nitride materials include indium nitride, gallium nitride, indium gallium nitride, aluminum gallium nitride and aluminum nitride. The materials of the layer structure 900 are chosen to balance a strain across the structure such that the III-nitride layer 918 does not have dislocations or other defects. One way to do this is to select materials such that the lattice constant of the metal oxide layer 214 is less than the lattice constant of the III-nitride layer 918 but greater than the lattice constant of the rare earth oxide layer 210. In addition, the lattice constant of the rare earth oxide layer 210 is less than the lattice constant of the silicon layer 202. Indium nitride (InN) has a lattice constant of approximately 3.54 Å as shown in FIG. 4 and is an example of a III-nitride that fits these conditions. As an example, $(Sc_{0.65}Er_{0.35})_2O_3$ is lattice matched to $In_2O_3$, and $(Sc_{0.8}Er_{0.2})_2O_3(111)$ is lattice matched to InN(0001).

In another example, the layer structure 900 comprises an RF filter structure. In this example, the III-nitride layer 918 comprises aluminum nitride. The RF filter structure comprises the III-nitride layer 918 and the metal oxide layer 214.

The rare earth oxide layer 210 acts as a buffer to the underlying silicon layer 202. An acoustic mirror structure may also occur between the metal oxide layer 214 and the silicon layer 202.

Figure 10:
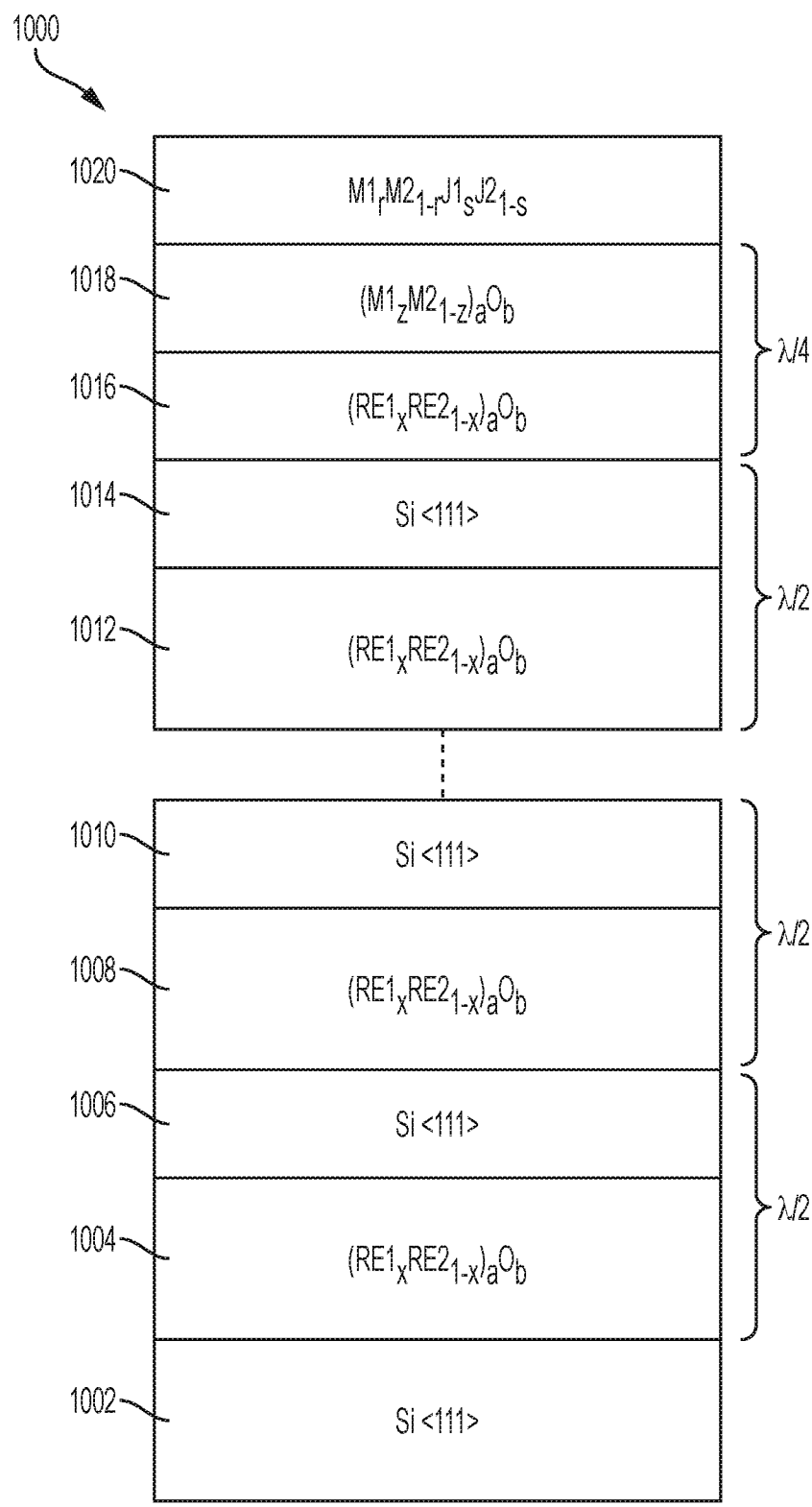
FIG. 10 depicts a layer structure that comprises a distributed Bragg reflector structure for photonic device applications, according to an illustrative implementation.

FIG. 10 depicts a layer structure 1000 that comprises a distributed Bragg reflector (DBR) structure for photonic device applications. The layer structure 1000 includes a silicon layer 1002, a number of pairs of rare earth oxide and silicon layers, a pair of metal oxide and rare earth oxide layers, and a metal-containing layer 1020. The silicon layer 1002 can be any silicon layer that provides an epitaxial template for growth of the layer structure 1000. The silicon layer 1002 is, for example, a silicon substrate with a crystal orientation of <111>, <110>, <112>, <113>, or <114>. However, the silicon layer 1002 can also be a silicon layer over an insulator layer, as in an SOI substrate, or can be a silicon layer epitaxially grown over another layer. The layer structure 1000 includes rare earth oxide layers 1004, 1008, 1012, and 1016 that have the chemical formula $(RE1_xRE2_{1-x})_aO_b$ ($0 \leq x \leq 1$; $1 \leq a \leq 3$; $2 \leq b \leq 4$). The layer structure 1000 also includes silicon layers 1006, 1010, and 1014 that have a <111> orientation. The layer structure 1000 also includes a metal oxide layer 1018 that has the chemical formula $(M1_zM2_{1-z})_aO_b$ ($0 \leq x \leq 1$; $1 \leq a \leq 3$; $2 \leq b \leq 4$). The metal-containing layer 1020 has the chemical formula $M1_rM2_{1-r}J1_sJ2_{1-s}$ ($0 \leq r \leq 1$; $0 \leq s \leq 1$). The pairs of rare earth oxide and silicon layers are 1004 and 1006, 1008 and 1010, and 1012 and 1014. Each of these pairs has a total thickness of $\lambda/2$, where $\lambda$ is the wavelength of the light which is to be reflected by the DBR structure. The final pair of layers 1016 and 1018 has a total thickness of $\lambda/4$. While the layer structure 1000 is depicted as including three pairs of rare earth oxide and silicon layers, other numbers of pairs are contemplated, and the number of pairs is chosen to result in sufficient reflectance. A larger number of pairs will result in a higher reflectance. By alternating rare earth oxide and silicon materials, the layer structure 1000 provides a DBR structure that can be a template for epitaxial growth of the layer 1020 and future layers.

Figure 11:
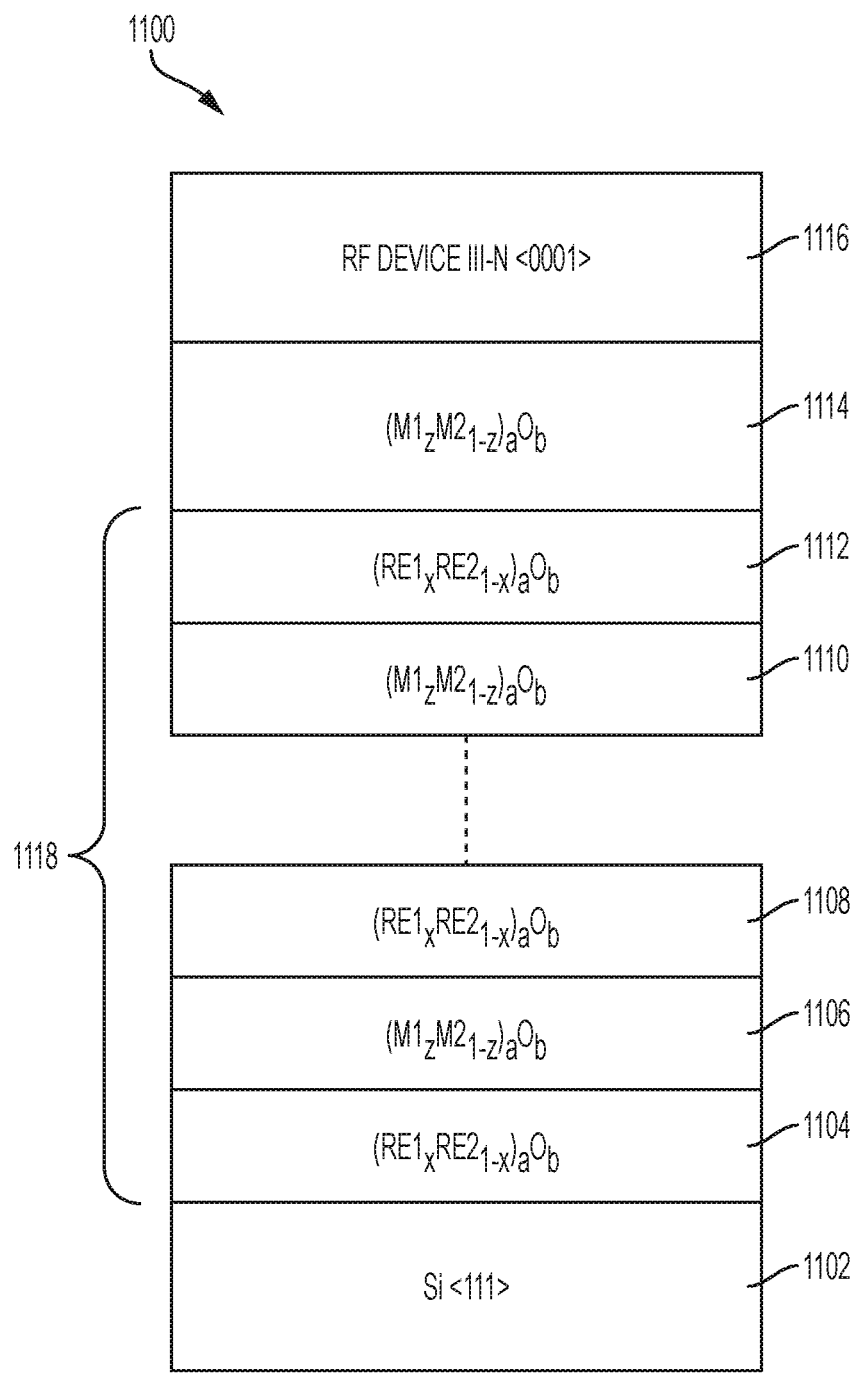
FIG. 11 depicts a layer structure that includes an acoustic mirror and an RF device, according to an illustrative implementation.

FIG. 11 depicts a layer structure 1100 that includes an acoustic mirror and an RF device. The layer structure 1100 includes a silicon layer 1102 with a <111> orientation and an acoustic mirror structure 1118 epitaxially grown over the silicon layer 1102. The silicon layer 1102 can be any silicon <111> layer that provides an epitaxial template for growth of the layer structure 1100. The silicon layer 1102 is, for example, a silicon substrate with a crystal orientation of <111>. However, the silicon layer 1102 can also be a silicon <111> layer over an insulator layer, as in an SOI substrate, or can be a silicon <111> layer epitaxially grown over another layer. The layer structure 1100 also includes a metal oxide layer 1114 epitaxially grown over the acoustic mirror structure 1118. The layer structure 1100 also includes a III-nitride structure 1116 that has a <0001> orientation and is epitaxially grown over the metal oxide layer 1114. The III-nitride structure 1116 includes an RF device, or layers used in fabricating an RF device. The acoustic mirror structure 1118 includes rare earth oxide layers 1104, 1108, and 1112 and metal oxide layers 1106 and 1110. The rare earth oxide layers 1104, 1108, and 1112 have a chemical formula of $(RE1_xRE2_{1-x})_aO_b$ ($0 \leq x \leq 1$; $1 \leq a \leq 3$; $2 \leq b \leq 4$). The metal oxide layers 1106, 1110, and 1114 have a chemical formula of $(M1_zM2_{1-z})_aO_b$ ($0 \leq x \leq 1$; $1 \leq a \leq 3$; $2 \leq b \leq 4$). The cations RE1 and RE2 are rare earth metals. The metal elements M1 and M2 are selected from transition metals, Group III metals such as aluminum, gallium, or indium, or Group IV metals such as tin or lead. Accordingly, the metal oxide layer 1106 is epitaxially grown over the rare earth oxide layer 1104, and the rare earth oxide layer 1108 is a second rare earth oxide epitaxially grown over the metal oxide layer 1106. The metal oxide layer 1110, or an intervening metal oxide layer, is a second metal oxide layer epitaxially grown over the second rare earth oxide layer 1108. The layers 1104, 1106, 1108, 1110, 1112, 1114, and intervening rare earth oxide and metal oxide layers not depicted in FIG. 11 all have bixbyite crystal structures. The acoustic mirror structure 1118 includes additional pairs of rare earth oxide and metal oxide layers like the layers 1110 and 1112. The rare earth elements RE1 and RE2 and the metal elements M1 and M2 are chosen such that there is an acoustic impedance delta between the metal oxides and rare earth oxides. The number of layers in the acoustic mirror structure 1118 is chosen to sufficiently reflect acoustic waves. By alternating layers of rare earth oxide and metal oxide, the layer structure 1100 provides an epitaxially grown III-nitride layer that is acoustically isolated from the silicon layer.

Figure 12:
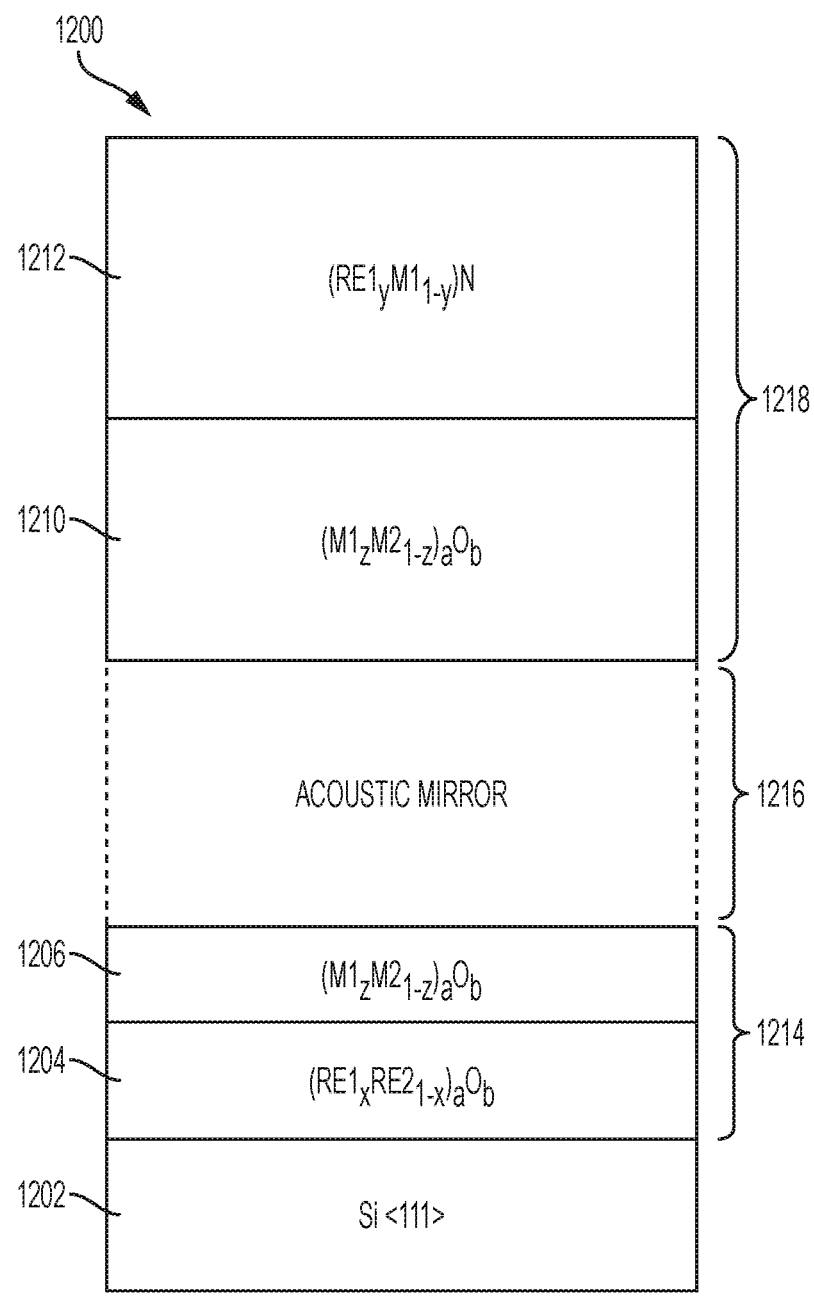
FIG. 12 depicts a layer structure comprising an RF filter based on a mixed metal and rare earth alloy, according to an illustrative implementation.

FIG. 12 depicts a layer structure comprising an RF filter based on a mixed metal and rare earth alloy. The layer structure 1200 includes a silicon layer 1202 having a <111> orientation, a buffer structure 1214, an optional acoustic mirror structure 1216, and an RF filter structure 1218. The silicon layer 1202 can be any silicon <111> layer that provides an epitaxial template for growth of the layer structure 1200. The silicon layer 1202 is, for example, a silicon substrate with a crystal orientation of <111>. However, the silicon layer 1202 can also be a silicon <111> layer over an insulator layer, as in an SOI substrate, or can be a silicon <111> layer epitaxially grown over another layer. The buffer structure 1214 includes a rare earth oxide layer 1204 that has a composition of $(RE1_xRE2_{1-x})_aO_b$ ($0 \leq x \leq 1$; $1 \leq a \leq 3$; $2 \leq b \leq 4$) and a metal oxide layer 1206 that has a composition of $(M1_zM2_{1-z})_aO_b$ ($0 \leq x \leq 1$; $1 \leq a \leq 3$; $2 \leq b \leq 4$). The acoustic mirror structure 1216, if included, has the structure of the acoustic mirror structure 1118. The RF filter structure 1218 includes a metal oxide layer 1210 with a composition of $(M1_zM2_{1-z})_aO_b$ ($0 \leq x \leq 1$; $1 \leq a \leq 3$; $2 \leq b \leq 4$) and a mixed nitride layer 1212 with a composition of $(RE1_yM1_{1-y})N$ ($0 \leq y \leq 1$). RE1 is a rare earth element and M1 is a metal selected from the transition metals, the Group III metals such as aluminum, gallium, or indium, or the Group IV metals such as tin or lead. An example of $(RE1_yM1_{1-y})N$ is $Al_ySc_{1-y}N$. If the difference in acoustic impedance between the metal oxide layer 1206 and the rare earth oxide layer 1204 is sufficiently high, then the acoustic mirror structure 1216 can be omitted. If the difference in acoustic impedance between the metal oxide layer 1206 and the rare earth oxide layer 1204 is not sufficiently high, the acoustic mirror structure 1216 provides sufficient acoustic isolation between the RF filter structure 1218 and the silicon layer 1202. Each of the layers in the layer structure 1200 is epitaxially grown over the layer below. By providing metal oxide and rare earth oxide layers between the silicon layer and the RF filter structure, the layer structure 1200 provides an epitaxially grown RF filter structure that is acoustically isolated from the substrate below.

Figure 13:
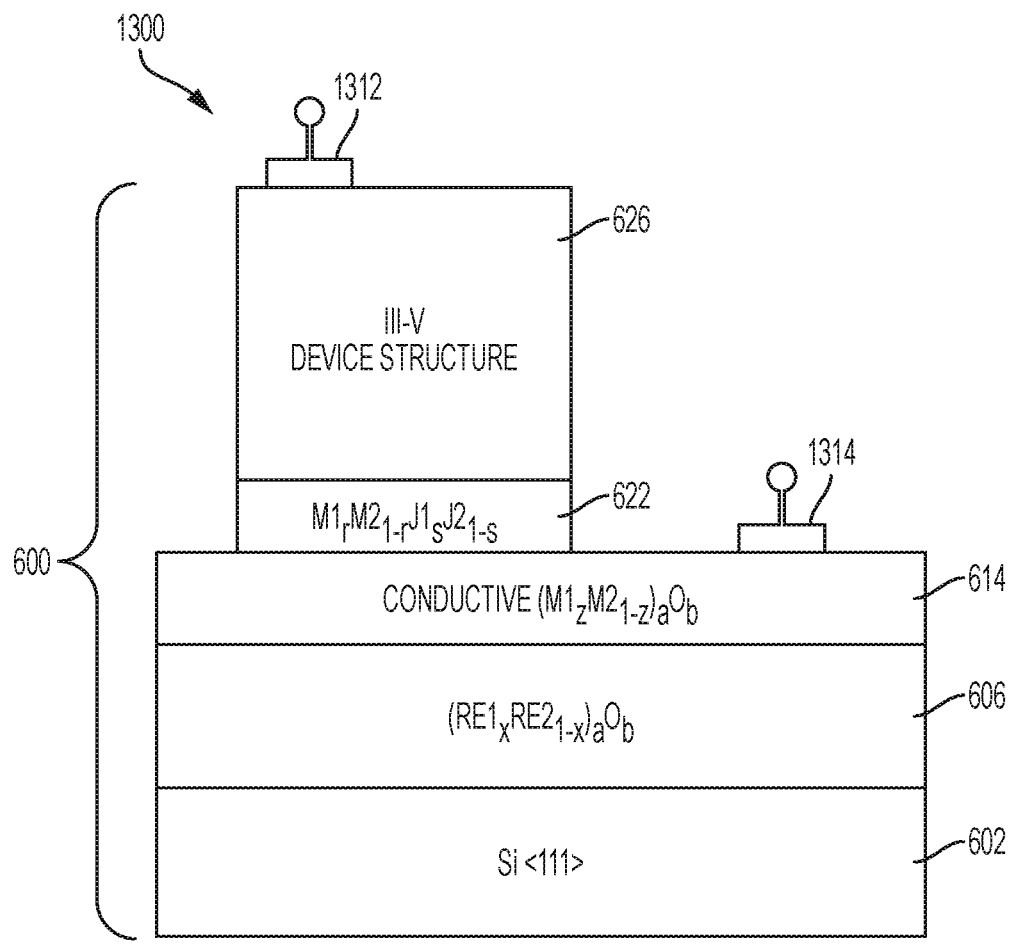
FIG. 13 depicts a photonic or electronic device that includes the layer structure, according to an illustrative implementation.

FIG. 13 depicts a photonic or electronic device 1300 that includes the layer structure 600. In addition to the layer structure 600, the device 1300 includes a top contact 1312 that contacts the top of the III-V device structure 626 and a bottom contact 1314 that contacts the metal oxide layer 614. To access the metal oxide layer 614, the III-V structure 626 and the metal-containing layer 622 are etched to form a mesa, thus exposing the metal oxide layer 614. The metal oxide layer 614 comprises a conductive metal oxide such as tin oxide or indium tin oxide. While FIG. 13 depicts an example of the layer structure 600 that does not include the metal-containing layer 618 or the rare earth oxide layer 610, either or both of these layers can be included in the device 1300. If included in the device 1300, these layers occur in the same location in the layer structure 600 as depicted in FIG. 6.

Figure 14:
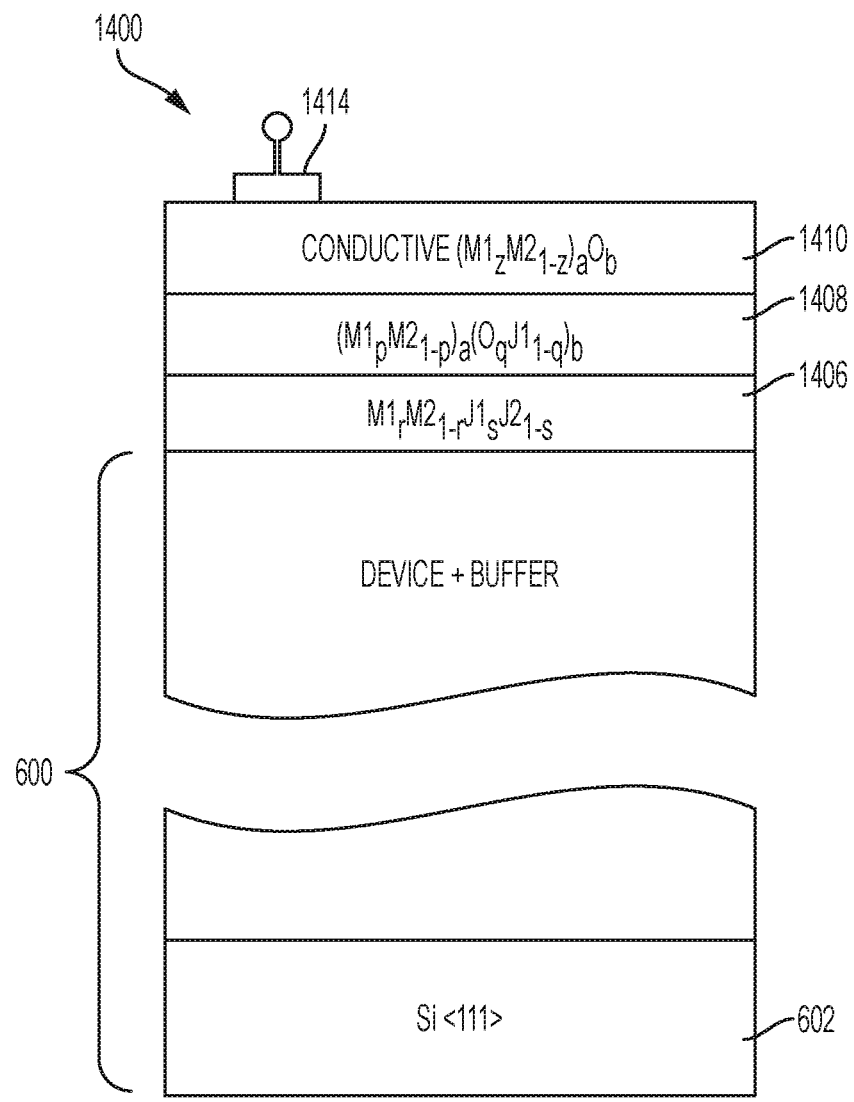
FIG. 14 depicts a device with a top crystalline epitaxial contact, according to an illustrative implementation.

FIG. 14 depicts a device 1400 with a top crystalline epitaxial contact. The device 1400 includes the layer structure 600, a metal-containing layer 1406 that has a composition of $M1_rM2_{1-r}J1_sJ2_{1-s}$ ($0 \leq r \leq 1$; $0 \leq s \leq 1$) and is epitaxially grown over the layer structure 600. The metal elements M1 and M2 are selected from transition metals, Group III metals such as aluminum, gallium, or indium, or Group IV metals such as tin or lead. The anion elements J1 and J2 are elements from Groups V or VI such as nitrogen, phosphorus, arsenic, antimony, sulfur, and selenium. The device 1400 also includes a metal oxide layer 1408 that has a composition of $(M1_pM2_{1-p})_a(O_qJ1_{1-q})_b$ ($0 \leq p \leq 1$; $0 \leq q \leq 1$; $1 \leq a \leq 3$; $2 \leq b \leq 4$) and is epitaxially grown over the metal-containing layer 1406. The elements M1, M2, and J1 in the metal oxide layer 1408 are the same elements as the elements M1, M2, and J1 in the metal-containing layer 1406. The layer structure 1400 also includes a conductive metal oxide layer 1410 that has a composition of $(M1_zM2_{1-z})_aO_b$ ($0 \leq x \leq 1$; $1 \leq a \leq 3$; $2 \leq b \leq 4$) and is epitaxially grown over the metal oxide layer 1408. In a particular example, the element M1 is indium and the element M2 is tin, such that the conductive metal oxide layer 1410 comprises indium tin oxide. The layer structure 1400 also includes a top contact 1414 that contacts the conductive metal oxide layer 1410. The transition between the layer structure 600 and the conductive metal oxide layer 1410 is accomplished by the layers 1406 and 1408 such that adjacent layers share a common anion. For example, the layers 1406 and 1408 share the anion J1, and the layers 1408 and 1410 share the anion O. All three layers share the metal elements M1 and M2, although the layers have different concentrations of these elements. By maintaining continuity of at least some of the elements in these layers, the transition to the conductive metal oxide layer 1410 occurs with minimal defects and dislocations.

In some examples, the elements M1, M2, and J1 in the metal oxide layer 1408 can be different than the elements M1, M2, and J1 in the metal-containing layer 1406.

Figure 15:
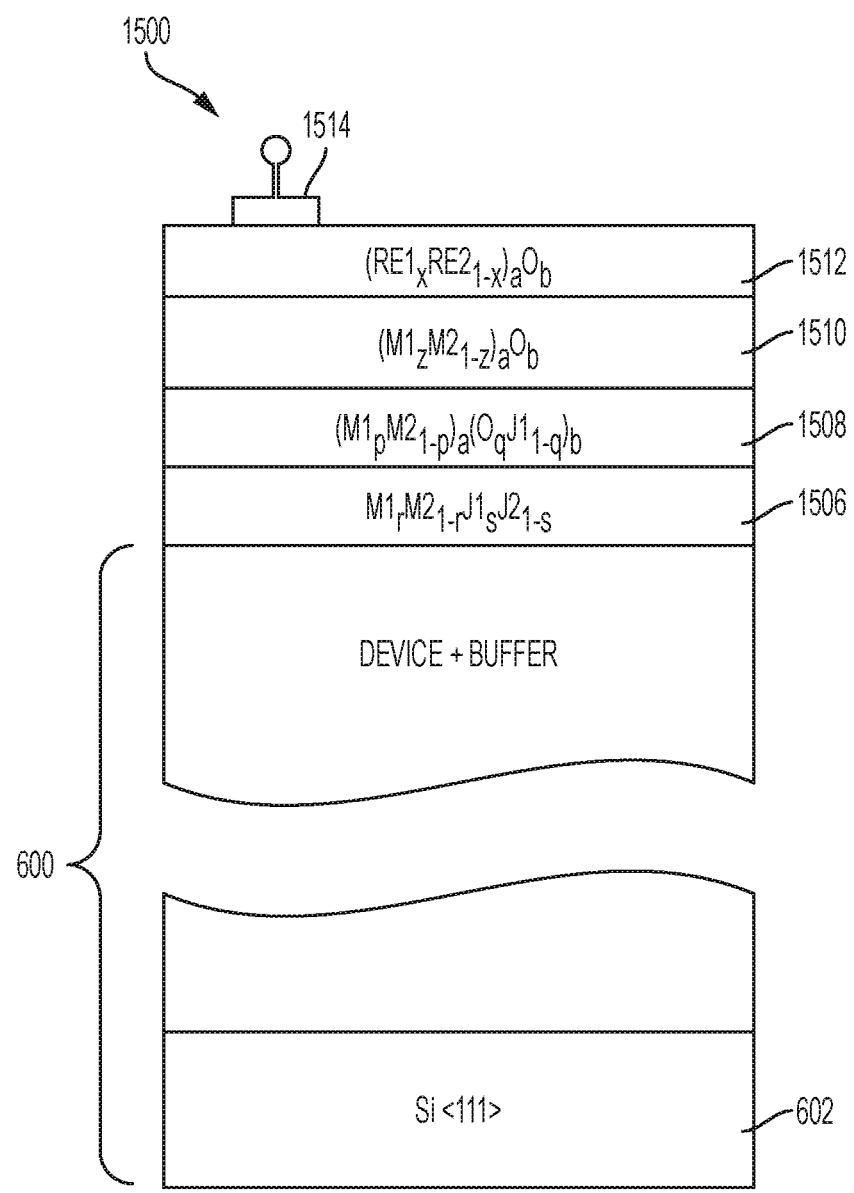
FIG. 15 depicts a device that includes a dielectric layer at the top surface, according to an illustrative implementation.

FIG. 15 depicts a device 1500 that includes a dielectric layer at the top surface. The device 1500 includes the layer structure 600 and a metal-containing layer 1506 that is epitaxially grown over the layer structure 600 and has a composition of $M1_rM2_{1-r}J1_sJ2_{1-s}$ ($0 \leq r \leq 1$; $0 \leq s \leq 1$). The layer structure 1500 also includes a metal oxide layer 1508 that is epitaxially grown over the metal-containing layer 1506 and has a composition of $(M1_pM2_{1-p})_a(O_qJ1_{1-q})_b$ ($0 \leq p \leq 1$; $0 \leq q \leq 1$; $1 \leq a \leq 3$; $2 \leq b \leq 4$). The layer structure 1500 also includes a metal oxide layer 1510 that is epitaxially grown over the metal oxide layer 1508 and has a composition of $(M1_zM2_{1-z})_aO_b$ ($0 \leq x \leq 1$; $1 \leq a \leq 3$; $2 \leq b \leq 4$). The metal elements M1 and M2 are selected from transition metals, Group III metals such as aluminum, gallium, or indium, or Group IV metals such as tin or lead. The anion elements J1 and J2 are elements from Groups V or VI such as nitrogen, phosphorus, arsenic, antimony, sulfur, and selenium. At least one of the metal elements M1 and M2 is the same element in both the layers 1506 and 1508, and the anion element J1 is the same element in both the layers 1506 and 1508. Thus, the layers 1506 and 1508 share both at least one common cation (M1 and/or M2) and a common anion (J1). In addition, at least one of the metal elements M1 and M2 is the same element in both the layers 1508 and 1510. Thus, the layers 1508 and 1510 share both at least one common cation (M1 and/or M2) and a common anion (O).

The layer structure 1500 also includes a rare earth oxide layer 1512 that is grown over the metal oxide layer 1510 and has a composition of $(RE1_xRE2_{1-x})_aO_b$ ($0 \leq x \leq 1$; $1 \leq a \leq 3$; $2 \leq b \leq 4$). The elements RE1 and RE2 are rare earth elements. Just as the layers 1406, 1408, and 1410 and the layer structure 1400 share one or more common elements across adjacent layers, the layers 1506, 1508, 1510, and 1512 share one or more common elements across adjacent layers as well and similarly result in a dislocation- and defect-free epitaxial layer structure. The rare earth oxide layer 1512 acts as a gate dielectric. The rare earth elements RE1 and RE2 are chosen for their dielectric properties to result in a sufficiently high and dielectric constant for the rare earth oxide layer 1512. By appropriately selecting the composition of each layer and by maintaining constant elements across adjacent films, the device 1500 results in a high-quality, dislocation-free epitaxial stack.

Figure 16:
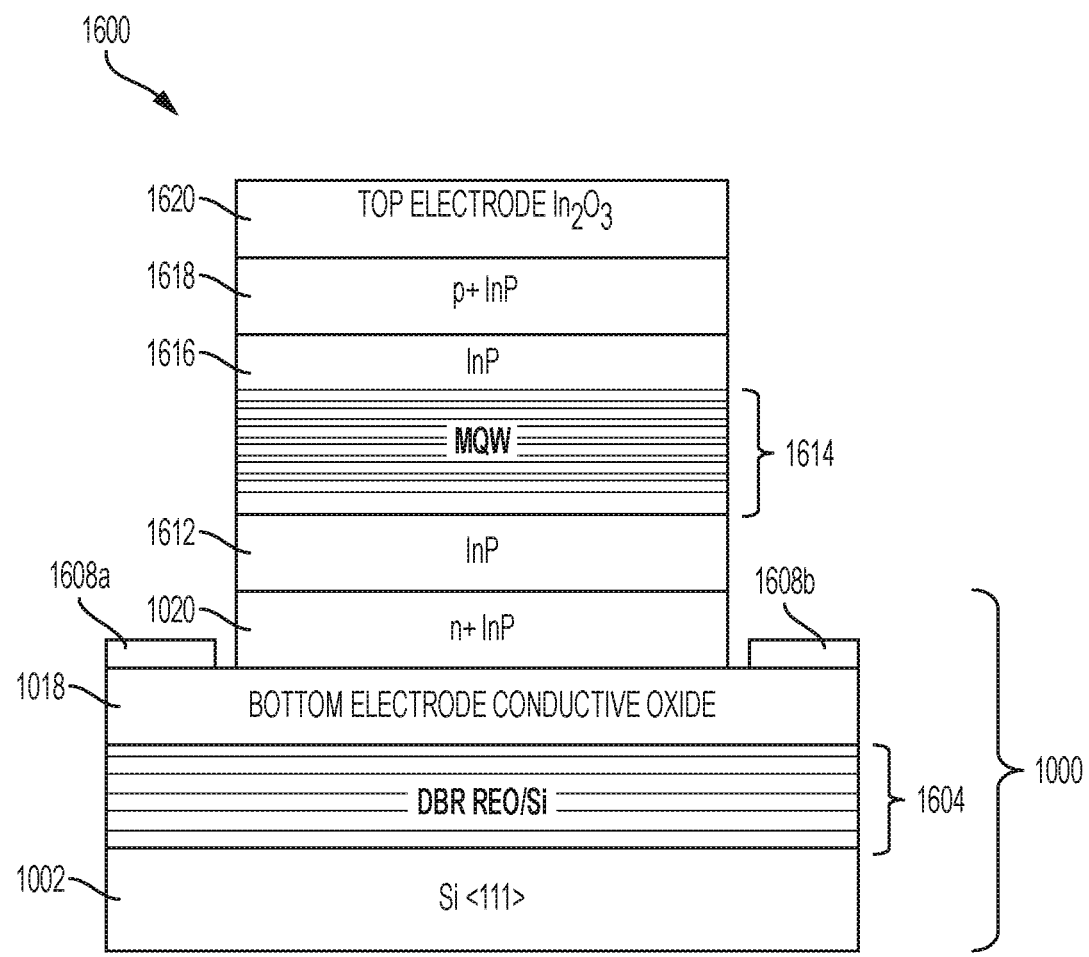
FIG. 16 depicts a photonic device epitaxially grown on silicon <111> using a rare earth oxide buffer layer, according to an illustrative implementation.

FIG. 16 depicts a photonic device 1600 epitaxially grown on silicon <111> using a rare earth oxide buffer layer. The photonic device 1600 includes the layer structure 1000 and includes additional layers epitaxially grown over the layer structure 1000. The photonic device 1600 includes the silicon layer 1002, which has a <111> orientation. The photonic device 1600 also includes a DBR 1604, epitaxially grown over the silicon layer 1602. The DBR 1604 comprises alternating rare earth oxide and silicon layers 1004, 1006, 1008, 1010, 1012, 1014, and 1016, depicted in FIG. 10. Because layer structure 1000 can comprise a different number of alternating rare earth oxide and silicon layers than depicted in FIG. 10, the DBR 1604 can comprise a different number of alternating rare earth oxide and silicon layers than depicted in FIG. 10. The photonic device 1600 also includes the metal oxide layer 1018 epitaxially grown over the DBR 1604. The photonic device 1600 also includes metal contacts 1608a and 1608b deposited on the metal oxide layer 1018. The metal contacts 1608a and 1608b can be epitaxially grown over the oxide layer 1606 or they can be non-epitaxially deposited, such as by physical vapor deposition or evaporation. The photonic device 1600 also includes the metal-containing layer 1020 epitaxially grown over the metal oxide layer 1018. In the photonic device 1600, the metal-containing layer 1020 comprises n$^+$ InP (highly-doped n-typed indium phosphide). The photonic device 1600 includes an indium phosphide layer 1612 epitaxially grown over the metal-containing layer 1020. The indium phosphide layer 1612 is unintentionally doped InP. The photonic device 1600 includes a multiple quantum well (MQW) structure 1614 epitaxially grown over the indium phosphide layer 1612. The MQW structure 1614 comprises alternating layers of material that form quantum wells epitaxially grown on each other and is the optically active portion of the photonic device 1600. The photonic device 1600 includes an indium phosphide layer 1616 epitaxially grown on the MQW structure 1614 and an indium phosphide layer 1618 epitaxially grown on the indium phosphide layer 1616. The indium phosphide layer 1616 is undoped (at least, it is not intentionally doped), while the indium phosphide layer 1618 comprises indium phosphide that is highly doped p-type (p$^+$ InP). The portions of the layers 1612 and 1616 that are adjacent to the layers 1020 and 1618 have a graded doping of the same type as the adjacent layer. The photonic device 1600 also includes a top electrode layer 1620 that comprises In$_2$O$_3$ and is epitaxially grown over the indium phosphide layer 1618. In some examples, the top electrode layer 1620 comprises indium tin oxide. By using the layer structure 1000 that includes rare earth oxide layers, the photonic device 1600 provides an epitaxially grown photonic device on a silicon substrate.

Figure 17:
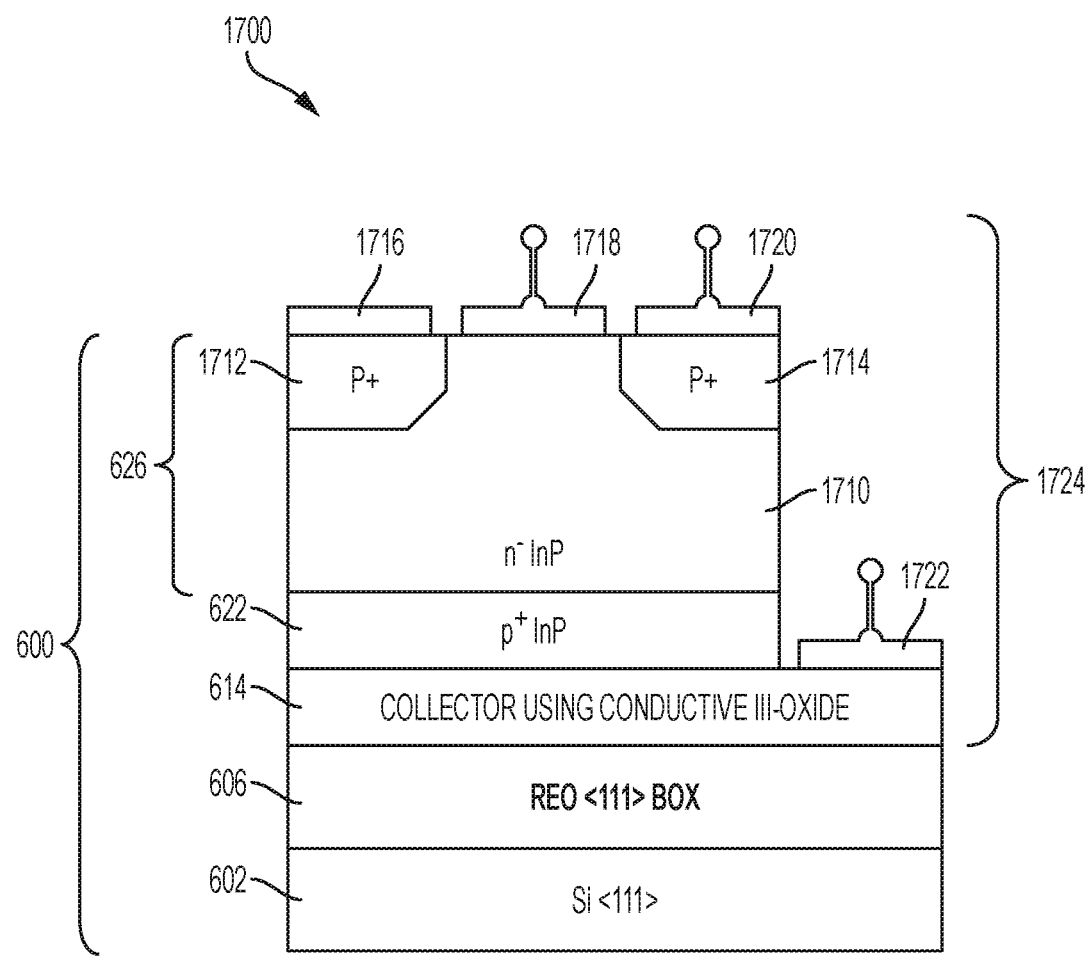
FIG. 17 depicts a bipolar transistor device that is grown on silicon using rare earth oxide as an intermediate layer, according to an illustrative implementation.

FIG. 17 depicts a bipolar transistor device 1700 that is grown on silicon using rare earth oxide as an intermediate layer. The device 1700 includes the layer structure 600 and has been further processed by etching and deposition to create a bipolar transistor 1724. In the example depicted in FIG. 17, the device 1700 includes the layers 602, 610, 614, 622, and 626 of the layer structure 600. The rare earth oxide layer 606 has a <111> orientation and is a rare earth oxide layer that both acts as a buffer for epitaxial growth of the metal oxide layer 614 and subsequent layers, and electrically insulates the silicon layer 602 from the layers above. The device 1700 includes $p^+$ doped regions 1712 and 1714 that serve as emitters in the bipolar transistor. The $p^+$ regions 1712 and 1714 comprise $p^+$ InP (highly-doped p-type indium phosphide). The indium phosphide layer 1710 serves as a base of the bipolar transistor 1724, and the metal oxide layer 614 serves as a collector electrode conductive layer of the bipolar transistor 1724. The metal oxide layer 614 comprises a Group III element. The bipolar transistor 1724 also includes base electrode 1718, emitter electrodes 1716 and 1720 and collector electrode 1722. In another example, device 1700 includes the layers depicted in FIG. 17 and also includes the layers 610 and 618 of the layer structure 600.

Figure 18:
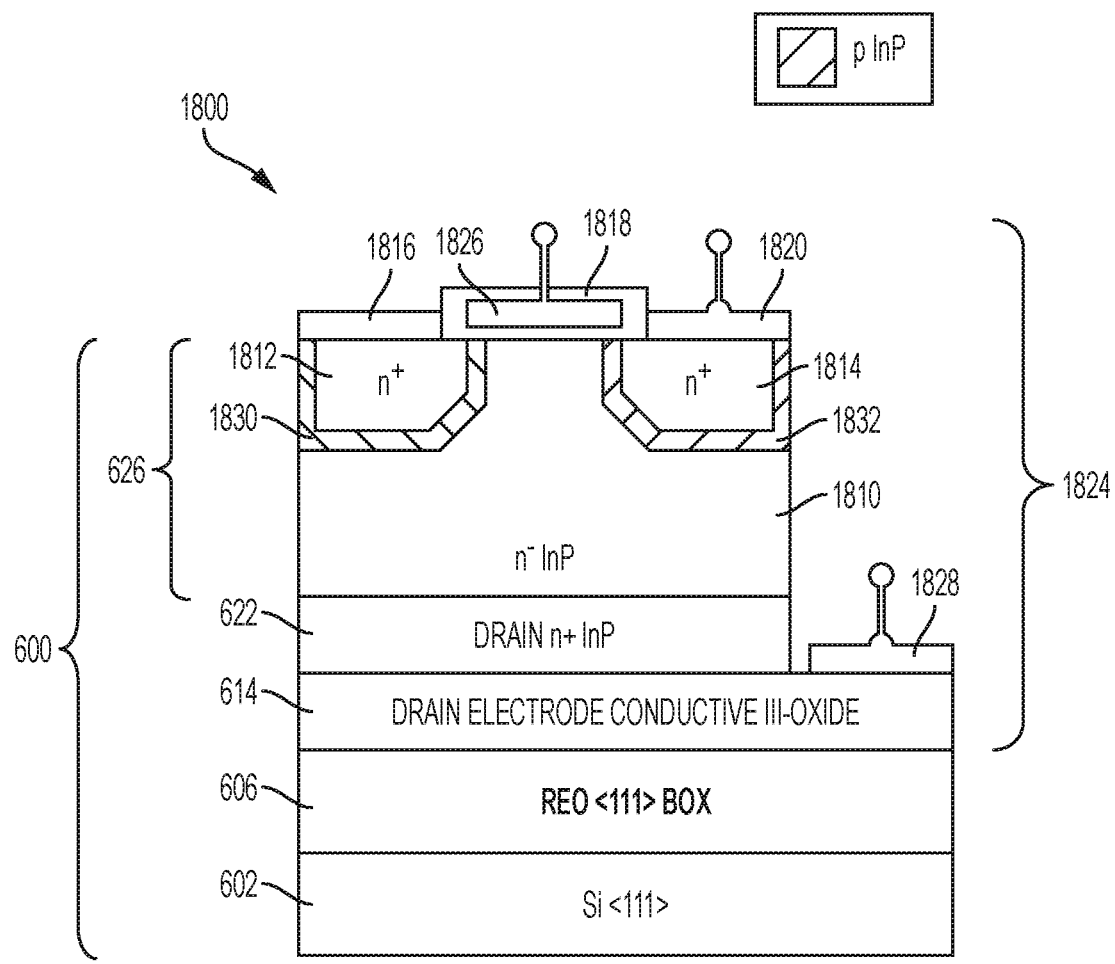
FIG. 18 depicts a device that comprises a field effect transistor on a silicon layer using a rare earth oxide layer as a buffer, according to an illustrative implementation.

FIG. 18 depicts a device 1800 that comprises a field effect transistor (FET) 1824 on a silicon layer 602 using a rare earth oxide layer 606 as a buffer. The device 1800 comprises the layer structure 600, including layers 602, 606, 614, 622, and 626. The layer 602 is a silicon layer with a <111> orientation. The rare earth oxide layer 606 has a <111> orientation as well and serves both to electrically insulate the FET 1824 from the silicon layer 602 and to provide a buffer layer for epitaxial growth of the metal oxide layer 614. The metal oxide layer 614 is a conductive Group III oxide such as indium oxide or indium tin oxide and serves as a drain electrode of the FET 1824. The metal-containing layer 622 comprises $n^+$ InP (highly-doped n-type indium phosphide) and serves as a drain of the FET 1824. The III-V device structure 626 includes an $n^-$ InP layer 1810, $n^+$ InP regions 1812 and 1814, and p-type InP regions 1830 and 1832. The $n^+$ InP regions 1812 and 1814 serve as sources of the FET 1824. The FET 1824 also includes a gate dielectric 1818 that comprises a rare earth oxide material. In addition, the FET 1824 comprises a gate electrode 1826, source contacts 1816 and 1820, and a drain contact 1828. By using a rare earth oxide layer as a buffer, a FET can be epitaxially grown on a silicon substrate.

Figure 19:
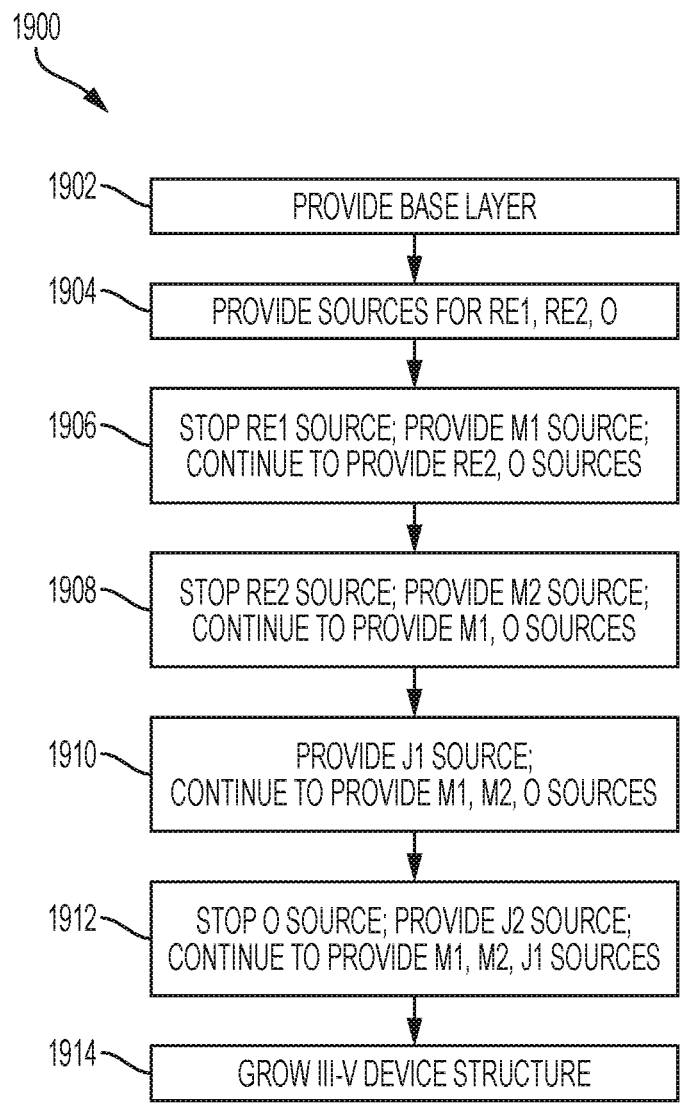
FIG. 19 depicts a flowchart of a method for growing the layer structure shown in FIG. 6, according to an illustrative implementation.

FIG. 19 depicts a flowchart of a method 1900 for growing the layer structure 600. At 1902, a base layer such as the silicon layer 602 is provided. At 1904, sources for rare earth elements RE1 and RE2 are provided, as well as an oxygen source. Examples of the sources for the elements RE1 and RE2 include Er and Sc. Examples of the oxygen source include $O_2$, $O_3$, and plasma activated atomic O. During step 1904, the rare earth oxide layer 606 is grown. At 1906, the source for the rare earth element RE1 is stopped, and a source for the metal element M1 is provided. The sources for the elements RE2 and O continue to be provided. Examples of the source for the M1 element includes In, Ga, and Al. During the step 1906, the rare earth oxide layer 610 is grown.

At 1908, the source for the rare earth element RE2 is stopped, and the source for metal element M2 is provided. The sources for the elements M1 and O continue to be provided. Examples of sources for the metal element M2 include Sn and Pb. During the step 1908, the layer 614 is grown. At 1910, a source for the element J1 is provided, and the sources for the elements M1, M2 and O continue to be provided. Examples of sources for the element J1 include N. During the step 1910, the layer 618 is grown. At 1912, the source for the element O is stopped, and a source for the element J2 is provided. The sources for the elements M1, M2 and J1 continue to be provided. Examples of sources for the element J2 include As. In the step 1912, the metal-containing layer 622 is grown. At 1914, the III-V device structure 626 is grown. By maintaining continuity of one or more elements across layers, the layer structure 600 can be grown epitaxially with few defects or dislocations.

Figure 20:
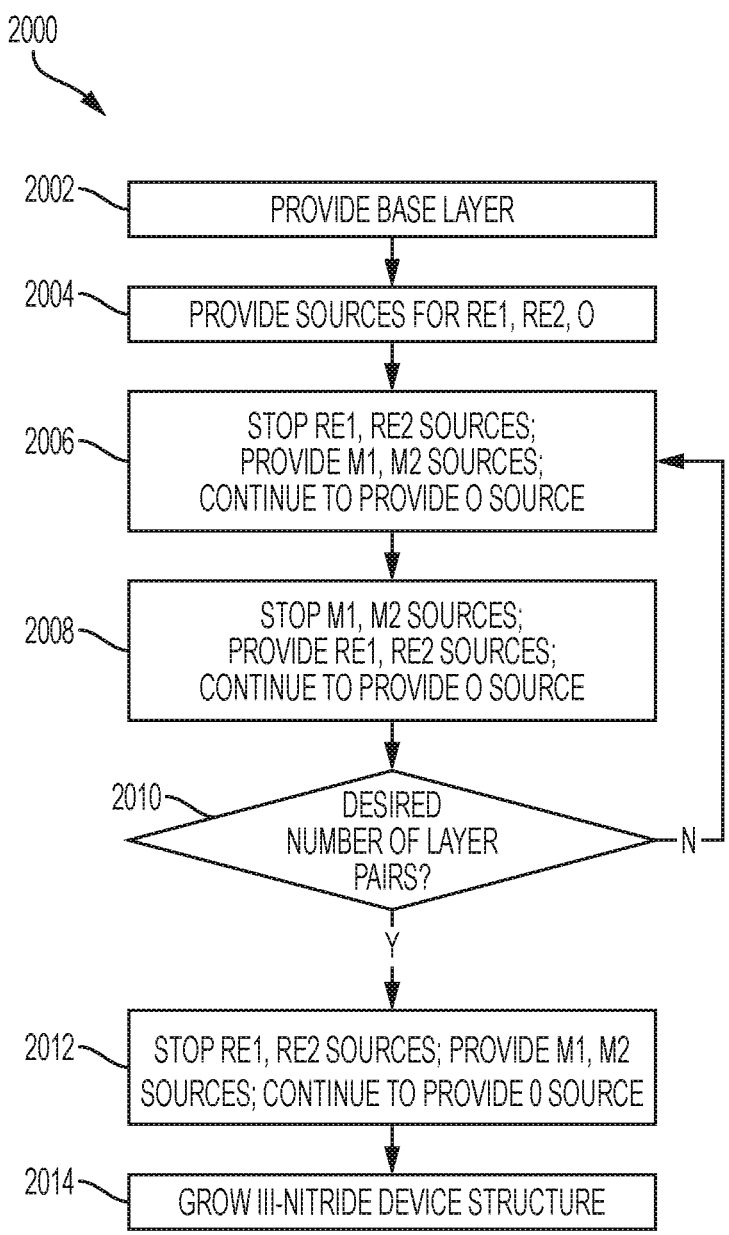
FIG. 20 depicts a flowchart of a method for growing the layer structure shown in FIG. 11, according to an illustrative implementation.

FIG. 20 depicts a flowchart of a method 2000 for growing the layer structure 1100. At 2002, a base layer such as the silicon layer 1102 is provided. At 2004, sources for the rare earth elements RE1 and RE2 and O are provided. Examples of sources for the rare earth elements RE1 and RE2 include Er, Sc. Examples of sources for O include $O_2$, $O_3$, plasma activated atomic O. During the step 2004, the rare earth oxide layer 1104 is grown. At 2006, the sources for the rare earth elements RE1 and RE2 are stopped, and sources for metal elements M1 and M2 are provided. Examples of sources for the metal elements M1 and M2 include In, Sn. During 2006, a metal oxide layer such as layers 1106 and 1110 are grown. At 2008, the sources for the metal elements M1 and M2 are stopped and the sources for the rare earth elements RE1 and RE2 are provided. The source for O continues to be provided. During the step 2008, rare earth oxide layers such as the layers 1108 and 1112 are grown.

At 2010, if the desired number of metal oxide/rare earth oxide where pairs have not yet been grown, the method 2000 returns to the step 2006. If the desired number of rare earth oxide/metal oxide layer pairs have not yet been grown, the method 2000 proceeds to step 2012. At 2012, the sources for the rare earth elements RE1 and RE2 are stopped and the sources for the metal elements M1 and M2 are provided. The source for O continues to be provided. During the step 2012, the metal oxide layer 1114 is grown. At 2014, a III-nitride device structure such as the III-nitride RF device 1116 is grown. By alternating rare earth oxide and metal oxide layers, the method 2000 provides an acoustic mirror to acoustically isolate the three-nitride device structure from the base layer.

The growth and/or deposition described herein can be performed using one or more of chemical vapor deposition (CVD), metalorganic chemical vapor deposition (MOCVD), organometallic vapor phase epitaxy (OMVPE), atomic layer deposition (ALD), molecular beam epitaxy (MBE), halide vapor phase epitaxy (HVPE), pulsed laser deposition (PLD), and/or physical vapor deposition (PVD).

III-nitride materials are semiconducting materials comprising nitrogen and one or more Group III elements. Common Group III elements used to form III-nitride materials include aluminum, gallium, and indium. III-nitride materials have large direct band gaps, making them useful for high-voltage devices, radio-frequency devices, and optical devices. Furthermore, because multiple Group III elements can be combined in a single III-nitride film in varying compositions, the properties of III-nitride films are highly tunable.

III-V and III-nitride materials can be grown using metalorganic chemical vapor deposition (MOCVD). In MOCVD, one or more Group III precursors react with a Group V precursor to deposit a III-nitride film on a substrate. Some Group III precursors include trimethylgallium (TMGa) as a gallium source, trimethylaluminum (TMA) as an aluminum source, and trimethylindium (TMI) as an indium source. Ammonia is a Group V precursor which can be used as a nitrogen source. Tert-butylarsine and arsine are Group V precursors which can be used as arsenic sources. Tert-butylphosphine and phosphine are Group V precursors which can be used as phosphorous sources.

As described herein, a layer means a substantially-uniform thickness of a material covering a surface. A layer can be either continuous or discontinuous (i.e., having gaps between regions of the material). For example, a layer can completely cover a surface, or be segmented into discrete regions, which collectively define the layer (i.e., regions formed using selective-area epitaxy). A layer structure means a set of layers, and can be a stand-alone structure or part of a larger structure. A III-nitride structure means a structure containing III-nitride material, and can contain additional materials other than III-nitrides, a few examples of which are Si, a silicon oxide ($SiO_x$), silicon nitride ($Si_xN_y$) and III-V materials. Likewise, a III-V structure means a structure containing III-V material, and can contain additional materials other than III-Vs, a few examples of which are Si, a silicon oxide ($SiO_x$), silicon nitride ($Si_xN_y$) and III-nitride materials (a subset of III-Vs).

"Monolithically-integrated" means formed on the surface of the substrate, typically by depositing layers disposed on the surface.

Disposed on means "exists on" an underlying material or layer. This layer may comprise intermediate layers, such as transitional layers, necessary to ensure a suitable surface. For example, if a material is described to be "disposed on a substrate," this can mean either (1) the material is in direct contact with the substrate; or (2) the material is in contact with one or more transitional layers that reside on the substrate.

Single-crystal means a crystal structure that comprises substantially only one type of unit-cell. A single-crystal layer, however, may exhibit some crystal defects such as stacking faults, dislocations, or other commonly occurring crystal defects.

Single-domain means a crystalline structure that comprises substantially only one structure of unit-cell and substantially only one orientation of that unit cell. In other words, a single-domain crystal exhibits no twinning or anti-phase domains.

Single-phase means a crystal structure that is both single-crystal and single-domain.

Crystalline means a crystal structure that is substantially single-crystal and substantially single-domain. Crystallinity means the degree to which a crystal structure is single-crystal and single-domain. A highly crystalline structure would be almost entirely, or entirely single-crystal and single-domain.

Epitaxy, epitaxial growth, and epitaxial deposition refer to growth or deposition of a crystalline layer on a crystalline substrate. The crystalline layer is referred to as an epitaxial layer. The crystalline substrate acts as a template and determines the orientation and lattice spacing of the crystalline layer. The crystalline layer can be, in some examples, lattice matched or lattice coincident. A lattice matched crystalline layer can have the same or a very similar lattice spacing as the top surface of the crystalline substrate. A lattice coincident crystalline layer can have a lattice spacing that is an integer multiple, or very similar to an integer multiple, of the lattice spacing of the crystalline substrate. Alternatively, the lattice spacing of the crystalline substrate can be an integer multiple, or very similar to an integer multiple, of the lattice spacing of the lattice coincident crystalline layer. The quality of the epitaxy is based in part on the degree of crystallinity of the crystalline layer. Practically, a high quality epitaxial layer will be a single crystal with minimal defects and few or no grain boundaries.

Substrate means the material on which deposited layers are formed. Exemplary substrates include, without limitation: bulk silicon wafers, in which a wafer comprises a homogeneous thickness of single-crystal silicon; composite wafers, such as a silicon-on-insulator wafer that comprises a layer of silicon that is disposed on a layer of silicon dioxide that is disposed on a bulk silicon handle wafer; or any other material that serves as base layer upon which, or in which, devices are formed. Examples of such other materials that are suitable, as a function of the application, for use as substrate layers and bulk substrates include, without limitation, gallium nitride, silicon carbide, gallium oxide, germanium, alumina, gallium-arsenide, indium-phosphide, silica, silicon dioxide, borosilicate glass, pyrex, and sapphire.

REO substrate means a composition that comprises a single crystal rare earth oxide layer and a substrate. Examples of the rare earth oxides are gadolinium oxide ($Gd_2O_3$), erbium oxide ($Er_2O_3$) and ytterbium oxide ($Yb_2O_3$). The substrate consists of Si <100>, Si <111> or other suitable materials. The rare earth oxide layer is epitaxially deposited on the substrate.

Semiconductor-on-Insulator means a composition that comprises a single-crystal semiconductor layer, a single-phase dielectric layer, and a substrate, wherein the dielectric layer is interposed between the semiconductor layer and the substrate. This structure is reminiscent of prior-art silicon-on-insulator ("SOI") compositions, which typically include a single-crystal silicon substrate, a non-single-phase dielectric layer (e.g., amorphous silicon dioxide, etc.) and a single-crystal silicon semiconductor layer.

Semiconductor-on-insulator compositions include a dielectric layer that has a single-phase morphology, whereas SOI wafers do not. In fact, the insulator layer of typical SOI wafers is not even single crystal.

Semiconductor-on-insulator compositions include a silicon, germanium, or silicon-germanium "active" layer, whereas prior-art SOI wafers use a silicon active layer. In other words, exemplary semiconductor-on-insulator compositions include, without limitation: silicon-on-insulator, germanium-on-insulator, and silicon-germanium-on-insulator.

A first layer described and/or depicted herein as "on" or "over" a second layer can be immediately adjacent to the second layer, or one or more intervening layers can be between the first and second layers. An intervening layer described and/or depicted as "between" first and second layers can be immediately adjacent to the first and/or the second layers, or one or more additional intervening layers may be between the intervening layer and the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

From the above description it is manifest that various techniques may be used for implementing the concepts described herein without departing from the scope of the disclosure. The described embodiments are to be considered in all respects as illustrative and not restrictive. It should also be understood that the techniques and structures described herein are not limited to the particular examples described herein, but can be implemented in other examples without departing from the scope of the disclosure. Similarly, while operations are depicted in the drawings in a particular order, this should not be understood as requiring that such operations be performed in the particular order shown or in sequential order, or that all illustrated operations be performed, to achieve desirable results. Additionally, the different examples described are not singular examples and features from one example may be included within the other disclosed examples. Accordingly, it will be understood that the claims are not to be limited to the examples disclosed herein, but is to be understood from the technical teachings provided above, as those teachings will inform the person of skill in the art.

What is claimed is:

1. A layer structure, comprising:
a base layer;
a first rare earth oxide layer epitaxially grown over the base layer, comprising:
a first rare earth element, and
oxygen,
wherein the first rare earth oxide layer has a bixbyite crystal structure; and
a metal oxide layer epitaxially grown directly over the first rare earth oxide layer, comprising:
a first cation element selected from Group III,
a second cation element selected from Group III or Group IV, and
oxygen,
wherein:
the metal oxide layer comprises a first region of the metal oxide layer adjacent to the first rare earth oxide layer and a second region of the metal oxide layer adjacent to a top surface of the metal oxide layer; and
a concentration of the second cation element varies from approximately zero at the first region to a maximum at the second region in a graded or stepwise manner, and
the metal oxide layer has a bixbyite crystal structure.

2. The layer structure of claim 1, wherein the first rare earth oxide layer further comprises a second rare earth element.

3. The layer structure of claim 1, further comprising a III-nitride layer epitaxially grown over the metal oxide layer.

4. The layer structure of claim 1, further comprising a second rare earth oxide layer between the first rare earth oxide layer and the base layer.

5. The layer structure of claim 1, wherein the metal oxide layer includes a transition in crystal structure from bixbyite to a second crystal structure.

6. The layer structure of claim 1, further comprising:
a second rare earth oxide layer epitaxially grown over the metal oxide layer, comprising:
the first rare earth element, and
oxygen,
wherein the second rare earth oxide layer has a bixbyite crystal structure; and
a second metal oxide layer epitaxially grown directly over the second rare earth oxide layer, comprising:
the first cation element, and
oxygen,
wherein the second metal oxide layer has a bixbyite crystal structure.

7. A layer structure, comprising:
a base layer;
a first rare earth oxide layer epitaxially grown over the base layer and having a composition of $(RE1_x RE2_{1-x})_a O_b$ ($0 \leq x \leq 1$; $1 \leq a \leq 3$; $2 \leq b \leq 4$), wherein RE1 and RE2 respectively represent a first rare earth element and a second rare earth element; and
a metal oxide layer epitaxially grown directly over the first rare earth oxide layer, comprising:
a first cation element selected from Group III or Group IV;
a second cation element selected from Group III or Group IV; and
oxygen,
wherein:
the metal oxide layer comprises a first region of the metal oxide layer adjacent to the first rare earth oxide layer and a second region of the metal oxide layer adjacent to a top surface of the metal oxide layer; and
a concentration of the second cation element varies from approximately zero at the first region to a maximum at the second region in a graded or stepwise manner, and
the metal oxide layer does not contain nitrogen.

8. The layer structure of claim 7, further comprising a III-nitride layer epitaxially grown over the metal oxide layer.

9. The layer structure of claim 7, further comprising a second rare earth oxide layer between the first rare earth oxide layer and the base layer.

10. The layer structure of claim 7, wherein the metal oxide layer includes a transition in crystal structure from bixbyite to a second crystal structure.

11. The layer structure of claim 7, further comprising:
a second rare earth oxide layer epitaxially grown over the metal oxide layer, comprising:
the first rare earth element, and
oxygen,
wherein the second rare earth oxide layer has a bixbyite crystal structure; and
a second metal oxide layer epitaxially grown directly over the second rare earth oxide layer, comprising:
the first cation element, and
oxygen,
wherein the second metal oxide layer has a bixbyite crystal structure.

12. The layer structure of claim 11, wherein the second rare earth oxide layer further comprises the second rare earth element.

13. The layer structure of claim 11, further comprising a III-nitride layer epitaxially grown over the second metal oxide layer.

14. The layer structure of claim 6, wherein the second rare earth oxide layer further comprises the second rare earth element.

15. The layer structure of claim 6, further comprising a III-nitride layer epitaxially grown over the second metal oxide layer.

\* \* \* \* \*